(12) United States Patent
Yamazaki

(10) Patent No.: US 8,823,893 B2
(45) Date of Patent: Sep. 2, 2014

(54) LIQUID CRYSTAL DISPLAY DEVICE WITH TRANSISTOR INCLUDING OXIDE SEMICONDUCTOR LAYER AND ELECTRONIC DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 365 days.

(21) Appl. No.: 12/968,336

(22) Filed: Dec. 15, 2010

(65) Prior Publication Data
US 2011/0149185 A1 Jun. 23, 2011

(30) Foreign Application Priority Data

Dec. 18, 2009 (JP) .................................. 2009-288312
Apr. 13, 2010 (JP) .................................. 2010-092111

(51) Int. Cl.
*G02F 1/136* (2006.01)
*G09G 3/36* (2006.01)
*H01L 29/10* (2006.01)
*H01L 29/04* (2006.01)

(52) U.S. Cl.
USPC .................. 349/43; 349/42; 349/44; 349/45; 349/51; 349/52; 345/99; 257/59; 257/72

(58) Field of Classification Search
USPC ................ 349/42–46, 52; 345/92; 257/59, 72
See application file for complete search history.

(56) References Cited

U.S. PATENT DOCUMENTS

| | | | |
|---|---|---|---|
| 4,781,438 A | | 11/1988 | Noguchi |
| 5,124,768 A | * | 6/1992 | Mano et al. .................... 257/347 |
| 5,162,901 A | * | 11/1992 | Shimada et al. ................ 349/39 |
| 5,247,375 A | * | 9/1993 | Mochizuki et al. ............. 349/84 |

(Continued)

FOREIGN PATENT DOCUMENTS

| | | |
|---|---|---|
| CN | 101123194 A | 2/2008 |
| EP | 0276853 A | 8/1988 |

(Continued)

OTHER PUBLICATIONS

International Search Report (Application No. PCT/JP2010/071192) Dated Jan. 11, 2011.

(Continued)

*Primary Examiner* — Hoan C Nguyen
(74) *Attorney, Agent, or Firm* — Eric J. Robinson; Robinson Intellectual Property Law Office, P.C.

(57) ABSTRACT

To reduce power consumption and suppress display degradation of a liquid crystal display device. To suppress display degradation due to an external factor such as temperature. A transistor whose channel formation region is formed using an oxide semiconductor layer is used for a transistor provided in each pixel. Note that with the use of a high-purity oxide semiconductor layer, off-state current of the transistor at a room temperature can be 10 aA/μm or less and off-state current at 85° C. can be 100 aA/μm or less. Consequently, power consumption of a liquid crystal display device can be reduced and display degradation can be suppressed. Further, as described above, off-state current of the transistor at a temperature as high as 85° C. can be 100 aA/μm or less. Thus, display degradation of a liquid crystal display device due to an external factor such as temperature can be suppressed.

30 Claims, 9 Drawing Sheets

(56) References Cited

U.S. PATENT DOCUMENTS

| | | | |
|---|---|---|---|
| 5,294,555 A | 3/1994 | Mano et al. | |
| 5,554,861 A | 9/1996 | Mano | |
| 5,698,864 A | 12/1997 | Mano et al. | |
| 5,731,856 A | 3/1998 | Kim et al. | |
| 5,736,751 A | 4/1998 | Mano et al. | |
| 5,744,864 A | 4/1998 | Cillessen et al. | |
| 5,894,151 A * | 4/1999 | Yamazaki et al. | 257/347 |
| 6,242,777 B1 | 6/2001 | Mano et al. | |
| 6,294,274 B1 | 9/2001 | Kawazoe et al. | |
| 6,294,796 B1 | 9/2001 | Mano et al. | |
| 6,332,198 B1 | 12/2001 | Simons et al. | |
| 6,518,557 B1 | 2/2003 | Izumi et al. | |
| 6,563,174 B2 | 5/2003 | Kawasaki et al. | |
| 6,639,910 B1 | 10/2003 | Provencher et al. | |
| 6,654,903 B1 | 11/2003 | Sullivan et al. | |
| 6,658,579 B1 | 12/2003 | Bell et al. | |
| 6,658,580 B1 | 12/2003 | Bell et al. | |
| 6,727,522 B1 | 4/2004 | Kawasaki et al. | |
| 6,760,339 B1 | 7/2004 | Noel et al. | |
| 6,868,092 B1 | 3/2005 | Bell et al. | |
| 6,876,652 B1 | 4/2005 | Bell et al. | |
| 6,880,086 B2 | 4/2005 | Kidder et al. | |
| 6,930,890 B1 | 8/2005 | Branscomb | |
| 6,934,749 B1 | 8/2005 | Black et al. | |
| 7,039,046 B1 | 5/2006 | Simons et al. | |
| 7,049,190 B2 | 5/2006 | Takeda et al. | |
| 7,054,272 B1 | 5/2006 | Noel et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,111,053 B1 | 9/2006 | Black et al. | |
| 7,143,153 B1 | 11/2006 | Black et al. | |
| 7,211,825 B2 | 5/2007 | Shih et al | |
| 7,222,147 B1 | 5/2007 | Black et al. | |
| 7,240,364 B1 | 7/2007 | Branscomb et al. | |
| 7,263,597 B2 | 8/2007 | Everdell et al. | |
| 7,266,595 B1 | 9/2007 | Black et al. | |
| 7,280,529 B1 | 10/2007 | Black et al. | |
| 7,282,782 B2 | 10/2007 | Hoffman et al. | |
| 7,286,108 B2 | 10/2007 | Tsuda et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,767,106 B2 | 8/2010 | Chang | |
| 7,804,088 B2 | 9/2010 | Tanaka et al. | |
| 8,243,027 B2 | 8/2012 | Hotelling et al. | |
| 8,284,169 B2 | 10/2012 | Nagata et al. | |
| 8,384,077 B2 | 2/2013 | Yano et al. | |
| 8,530,246 B2 | 9/2013 | Ofuji et al. | |
| 2001/0046027 A1 | 11/2001 | Tai et al. | |
| 2002/0001307 A1 | 1/2002 | Nguyen et al. | |
| 2002/0056838 A1 | 5/2002 | Ogawa | |
| 2002/0057018 A1 | 5/2002 | Branscomb et al. | |
| 2002/0089624 A1 * | 7/2002 | Matsumoto | 349/106 |
| 2002/0116485 A1 | 8/2002 | Black et al. | |
| 2002/0118031 A1 | 8/2002 | Sweeney et al. | |
| 2002/0132454 A1 | 9/2002 | Ohtsu et al. | |
| 2002/0165961 A1 | 11/2002 | Everdell et al. | |
| 2003/0102424 A1 * | 6/2003 | Izumi et al. | 250/208.1 |
| 2003/0120822 A1 | 6/2003 | Langrind et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0195149 A1 * | 9/2005 | Ito | 345/98 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0097991 A1 | 5/2006 | Hotelling et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0142281 A1 | 6/2008 | Geaghan | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0085891 A1 * | 4/2009 | Yang et al. | 345/174 |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0155940 A1 * | 6/2009 | Lee et al. | 438/29 |
| 2009/0160817 A1 | 6/2009 | Wu et al. | |
| 2009/0239335 A1 | 9/2009 | Akimoto et al. | |
| 2009/0250695 A1 | 10/2009 | Tanaka et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

(56) References Cited

U.S. PATENT DOCUMENTS

| | | | |
|---|---|---|---|
| 2010/0136743 A1 | 6/2010 | Akimoto et al. | |
| 2010/0140612 A1 | 6/2010 | Omura et al. | |
| 2010/0149138 A1* | 6/2010 | Lee et al. ............. | 345/204 |
| 2010/0194697 A1 | 8/2010 | Hotelling et al. | |
| 2010/0214261 A1 | 8/2010 | Yamanaka et al. | |
| 2010/0309183 A1 | 12/2010 | Mizusako | |
| 2011/0025640 A1 | 2/2011 | Lin et al. | |
| 2011/0267303 A1 | 11/2011 | Chen et al. | |
| 2011/0290631 A1 | 12/2011 | Kuriki | |

FOREIGN PATENT DOCUMENTS

| | | | |
|---|---|---|---|
| EP | 1737044 A | 12/2006 | |
| EP | 1770788 A | 4/2007 | |
| EP | 1995787 A | 11/2008 | |
| EP | 1998373 A | 12/2008 | |
| EP | 1998374 A | 12/2008 | |
| EP | 1998375 A | 12/2008 | |
| EP | 2226847 A | 9/2010 | |
| JP | 58-178564 A | 10/1983 | |
| JP | 60-198861 A | 10/1985 | |
| JP | 63-186216 A | 8/1988 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 06-163900 A | 6/1994 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2001-312253 A | 11/2001 | |
| JP | 2002-076356 A | 3/2002 | |
| JP | 2002-098990 A | 4/2002 | |
| JP | 2002-289859 A | 10/2002 | |
| JP | 2003-058114 A | 2/2003 | |
| JP | 2003-086000 A | 3/2003 | |
| JP | 2003-086808 A | 3/2003 | |
| JP | 2003-534748 | 11/2003 | |
| JP | 2004-103957 A | 4/2004 | |
| JP | 2004-273614 A | 9/2004 | |
| JP | 2004-273732 A | 9/2004 | |
| JP | 2008-042067 A | 2/2008 | |
| JP | 2009-010362 A | 1/2009 | |
| JP | 2009-021612 A | 1/2009 | |
| JP | 2009-075385 A | 4/2009 | |
| JP | 2009-267399 A | 11/2009 | |
| JP | 2009-277702 A | 11/2009 | |
| JP | 2010-243707 A | 10/2010 | |
| JP | 2010-281934 A | 12/2010 | |
| JP | 2011-070092 | 4/2011 | |
| JP | 2011-237760 A | 11/2011 | |
| WO | WO-01/90843 | 11/2001 | |
| WO | WO-01/90865 | 11/2001 | |
| WO | WO-01/91345 | 11/2001 | |
| WO | WO-2004/114391 | 12/2004 | |
| WO | WO-2007/026764 | 3/2007 | |
| WO | WO-2008/149873 | 12/2008 | |
| WO | WO-2009/139482 | 11/2009 | |
| WO | WO-2011/074391 | 6/2011 | |

OTHER PUBLICATIONS

Written Opinion (Application No. PCT/JP2010/071192) Dated Jan. 11, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ulraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-cystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Empolying $MOO_3$ as a Charge-Generation Layer,", Adv. Mater. (Advanced Materials), 2006, vol. 18, No. 3, pp. 339-342.

Tsuda.K at al., "Ultra Low Power Consumption Technologies for Mobile TFT-LCDs ,", IDW '02 : Proceedings of the 9th International Display Workshops, Dec. 4, 2002, pp. 295-298.

(56) References Cited

OTHER PUBLICATIONS

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium13 Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YBFE2O4, and YB2FE3O7 Types of Structures for Compounds in the In2O3 and Sc2O3—A2O3—Bo Systems [A; Fe, Ga, or Al; B; Mg, Mn, Fe, Ni, Cu,or Zn] at Temperatures over 1000° C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 1, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

(56) References Cited

OTHER PUBLICATIONS

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Godo.H et al., "Modeling and Measurement of Ultra-low Leakage Current of IGZO TFTs and New Driving Method of LCDs,", IDW '10 : Proceedings of the 17th International Display Workshops, Dec. 1, 2010, pp. 235-238.

Notification (Application No. 2012-137529) Dated Feb. 26, 2013.

Information Offer Form (Application No. 2012-137529) Dated Jan. 29, 2013.

Chinese Office Action (Application No. 201310098260.2) Dated Mar. 3, 2014.

Chinese Office Action (Application No. 201080057378.5) Dated Jun. 13, 2014.

* cited by examiner

LIQUID CRYSTAL DISPLAY DEVICE WITH TRANSISTOR INCLUDING OXIDE SEMICONDUCTOR LAYER AND ELECTRONIC DEVICE

TECHNICAL FIELD

The present invention relates to a liquid crystal display device and an electronic device including the liquid crystal display device.

BACKGROUND ART

Liquid crystal display devices are widely used for display devices ranging from large-sized display devices such as television sets to small-sized display devices such as mobile phones. Therefore, the development of liquid crystal display devices is intended to achieve cost reduction or to provide high-value added liquid crystal display devices. In recent years in particular, there has been a growing interest in global environment and the development of liquid crystal display devices consuming less power has thus attracted attention.

Technique for reducing power consumption in a liquid crystal display device is disclosed in Patent Document 1. Specifically, a liquid crystal display device is disclosed in which all data signal lines are electrically separated from a data signal driver in an inactive period where all scan lines and data signal lines are in a non-selection state, so that a high impedance state is obtained.

REFERENCE

[Patent Document 1] Japanese Published Patent Application No. 2001-312253

DISCLOSURE OF INVENTION

A liquid crystal display device generally includes a pixel portion having a plurality of pixels arranged in a matrix form. The pixel includes a transistor which controls input of an image signal, a liquid crystal element to which voltage is applied in accordance with an image signal input, and an auxiliary capacitor which stores voltage applied to the liquid crystal element. The liquid crystal element includes a liquid crystal material which changes its alignment in accordance with voltage applied. By controlling the alignment of the liquid crystal material, display of each pixel is controlled.

In the liquid crystal display device disclosed in Patent Document 1, an image signal is not input to each pixel included in a pixel portion in the inactive period. That is, a transistor for controlling input of an image signal is kept turned off for a long period of time while an image signal is held in each pixel. Thus, the effect that leakage of an image signal through the transistor has on display of each pixel becomes apparent. Specifically, voltage applied to a liquid crystal element is reduced, whereby display degradation (change) of a pixel including the liquid crystal element becomes apparent.

Further, the amount of leakage of an image signal through the transistor is changed in accordance with operation temperature of the transistor. Specifically, the amount of leakage of an image signal through the transistor is increased along with increase in the operation temperature. Therefore, it is difficult for the liquid crystal display device disclosed in Patent Document 1 to maintain uniform display quality when being used in the outdoors where environments vary widely.

Thus, an object of an embodiment of the present invention is to reduce power consumption of a liquid crystal display device and to suppress display degradation (reduction in display quality).

An object of an embodiment of the present invention is to provide a liquid crystal display device in which display degradation (reduction in display quality) due to an external factor such as temperature is suppressed.

The aforementioned problems can be solved by using, as a transistor to be provided in each pixel, a transistor whose channel formation region is formed using an oxide semiconductor layer. Note that the oxide semiconductor layer is an oxide semiconductor layer which is highly purified by thoroughly removing impurities (hydrogen, water, or the like) to be electron suppliers (donors). In the transistor with a channel length of 10 μm, off-state current per micrometer in channel width at a room temperature can be 10 aA ($1 \times 10^{-17}$ A) or less (the value is represented by 10 aA/μm).

Further, the oxide semiconductor layer has a band gap of 2.0 eV or more, preferably 2.5 eV or more, still preferably 3.0 eV or more. In addition, increase in the purity of an oxide semiconductor layer allows the conductivity type of the oxide semiconductor layer to be as close to intrinsic as possible. Thus, in the oxide semiconductor layer, the generation of carriers due to thermal excitation can be suppressed. Therefore, the amount of increase in off-state current of a transistor with an increase in the operation temperature can be reduced. Specifically, in a transistor with a channel length of 10 μm, off-state current per micrometer in channel width at 85° C. can be 100 aA ($1 \times 10^{-16}$ A) or less (the value is represented by 100 aA/μm).

Specifically, an embodiment of the present invention is a liquid crystal display device including a plurality of pixels arranged in a matrix form, and each pixel has: a transistor, switching of which is controlled by a scan line driver circuit; a liquid crystal element including one terminal to which an image signal is input from a signal line driver circuit through the transistor and the other terminal to which a common potential is supplied, so that voltage is applied in accordance with the image signal; and a capacitor which stores voltage applied to the liquid crystal element. The liquid crystal display device further includes a control circuit which controls operation of the scan line driver circuit and the signal line driver circuit and selects input of the image signal to each pixel. In the liquid crystal display device, the transistor includes a channel formation region comprising an oxide semiconductor layer. In the liquid crystal display device, the amount of leakage of the image signal through the transistor in an off state is smaller than the amount of leakage of the image signal through the liquid crystal element.

In a liquid crystal display device which is an embodiment of the present invention, a transistor whose channel formation region is formed using an oxide semiconductor layer is used as the transistor provided in each pixel. Note that with the use of the high-purity oxide semiconductor layer, off-state current of the transistor at a room temperature can be 10 aA/μm or less and off-state current at 85° C. can be 100 aA/μm or less. Therefore, the amount of leakage of an image signal through the transistor can be reduced. That is, display degradation (change) which occurs when writing frequency of an image signal to a pixel included in the transistor is reduced can be suppressed. Thus, power consumption of the liquid crystal display device can be reduced and display degradation (reduction in display quality) can be suppressed.

Further, as described above, off-state current of the transistor at a temperature as high as 85° C. can be 100 aA/μm or less. That is, the transistor is a transistor in which an increase in off-state current which accompanies an increase in operation temperature is significantly small. Therefore, with the use of such a transistor as the transistor provided in each pixel of a liquid crystal display device, the effect that an external factor such as temperature has on leakage of an image signal in the pixel can be reduced. That is, the liquid crystal display device is a liquid crystal display device in which display degradation (reduction in display quality) can be suppressed even when the liquid crystal display device is used in the outdoors or the like where environments vary widely.

BEST MODE FOR CARRYING OUT THE INVENTION

Embodiments of the present invention will be described below in detail with reference to drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

Note that a source terminal and a drain terminal of a transistor change depending on the structure, the operating condition, and the like of the transistor. Therefore, in this document, one of terminals serving as source and drain of a transistor is referred to as a first terminal and the other thereof is referred to as a second terminal for distinction.

Note that the size, the thickness of a layer, or a region of each structure illustrated in drawings or the like in embodiments is exaggerated for simplicity in some cases. Therefore, embodiments of the present invention are not limited to such scales. Further, in this specification, ordinal numbers such as "first", "second", and "third" are used in order to avoid confusion among components, and the terms do not limit the components numerically.

(Embodiment 1)

In this embodiment, an example of an active matrix liquid crystal display device is described. Specifically, an active matrix liquid crystal display device which can select input of an image signal to a pixel portion is described with reference to FIGS. 1A and 1B, FIG. 2, and FIGS. 3A to 3C.

Figure 1A:
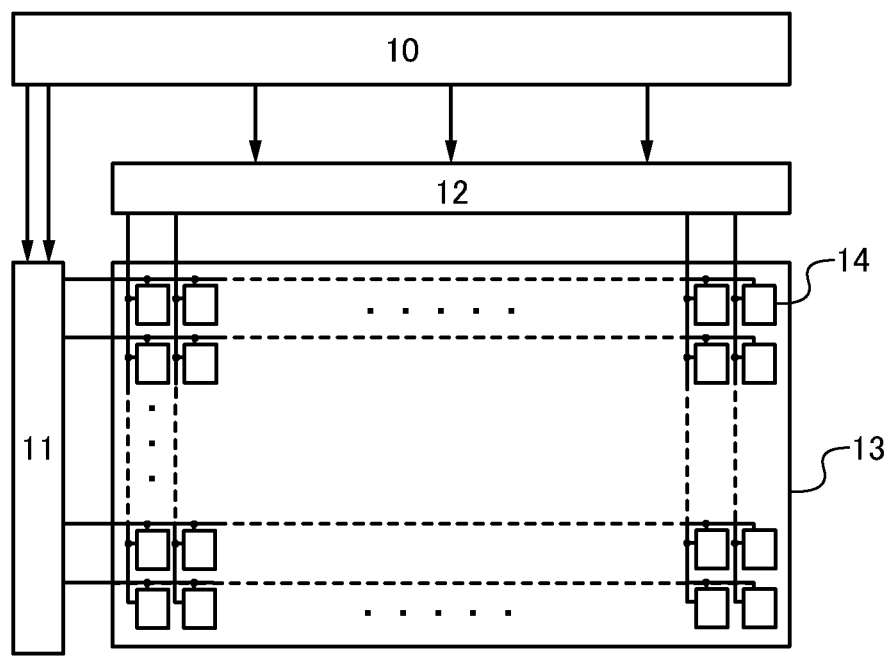
FIGS. 1A and 1B illustrate a liquid crystal display device in accordance with Embodiment 1.
Figure 1B:
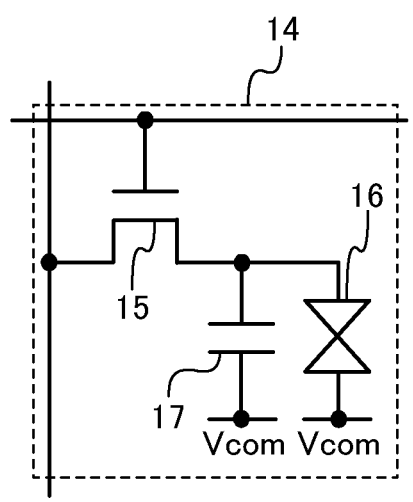

A structure example of a liquid crystal display device of this embodiment is described below with reference to FIGS. 1A and 1B. FIGS. 1A and 1B illustrate a structure example of a liquid crystal display device. The liquid crystal display device illustrated in FIG. 1A includes a control circuit 10, a scan line driver circuit 11, a signal line driver circuit 12, and a pixel portion 13. The pixel portion 13 includes a plurality of pixels 14 arranged in a matrix form. FIG. 1B illustrates a structure example of one of the pixels 14. The pixel 14 illustrated in FIG. 1B includes a transistor 15 having a gate terminal electrically connected to the scan line driver circuit 11, and a first terminal electrically connected to the signal line driver circuit 12; a liquid crystal element 16 having one terminal electrically connected to a second terminal of the transistor 15, and the other terminal electrically connected to a wiring which supplies a common potential ($V_{com}$); and a capacitor 17 having one terminal electrically connected to the second terminal of the transistor 15 and the one terminal of the liquid crystal element 16, and the other terminal electrically connected to a wiring which supplies a common potential ($V_{com}$).

In the liquid crystal display device of this embodiment, switching of the transistor 15 is controlled by the scan line driver circuit 11, and an image signal is input from the signal line driver circuit 12 to the liquid crystal element 16 through the transistor 15. Note that the liquid crystal element 16 includes a liquid crystal layer interposed between the one terminal and the other terminal. Voltage corresponding to a potential difference between the image signal and the common potential ($V_{com}$) is applied to the liquid crystal layer. With the voltage, an alignment state of the liquid crystal layer is controlled. In the liquid crystal display device of this embodiment, display of each pixel 14 is controlled with the use of the alignment. Note that the capacitor 17 is provided in order to store voltage applied to the liquid crystal element 16.

Further, in the liquid crystal display device in this embodiment, operation of the scan line driver circuit 11 and the signal line driver circuit 12 is controlled by the control circuit 10, whereby input of an image signal to the pixel portion 13 can be selected.

Next, a specific example of components of the liquid crystal display device of this embodiment is described.

<Control Circuit 10>

Figure 2:
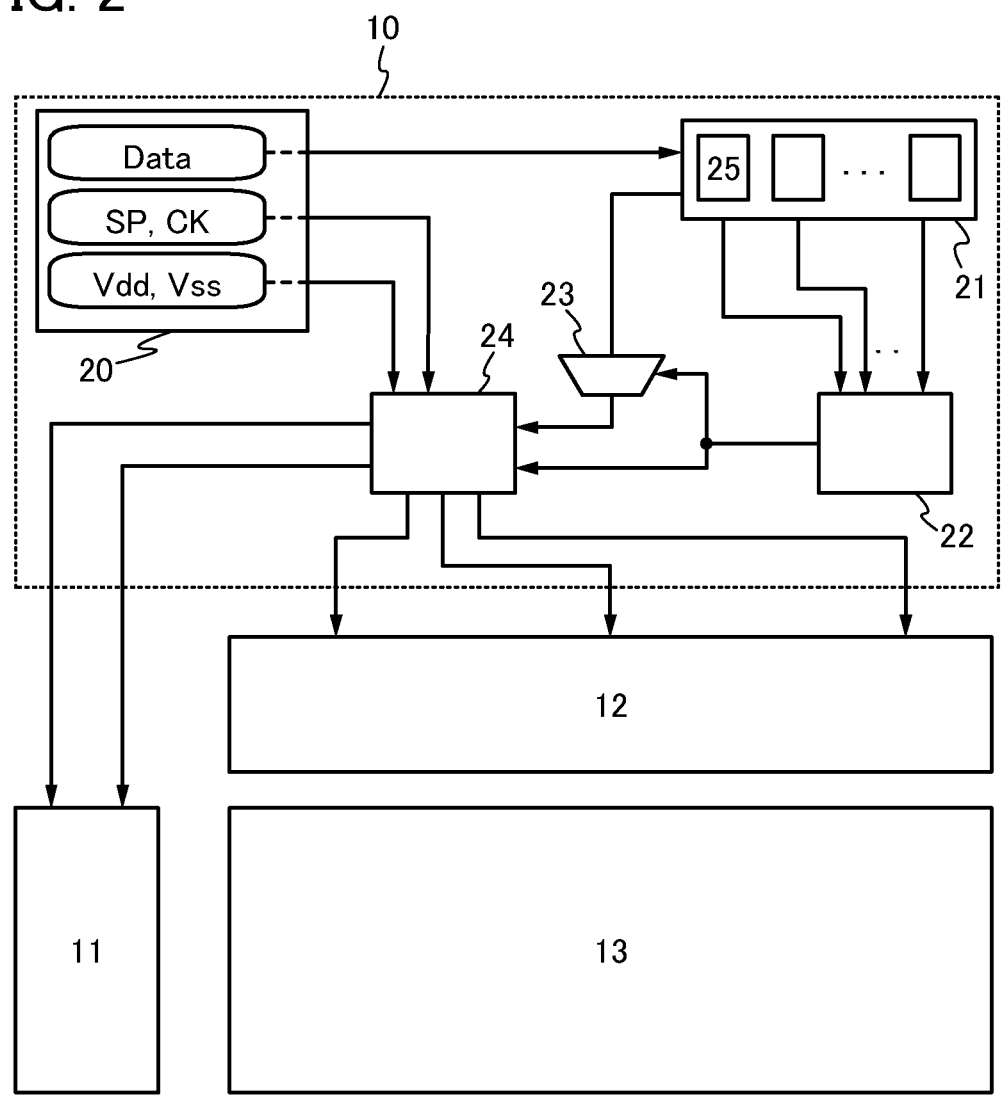
FIG. 2 illustrates a liquid crystal display device in accordance with Embodiment 1.

FIG. 2 illustrates a structure example of the control circuit 10. The control circuit 10 illustrated in FIG. 2 includes a signal generation circuit 20, a memory circuit 21, a comparison circuit 22, a selection circuit 23, and a display control circuit 24.

The signal generation circuit 20 is a circuit which generates a signal for operating the scan line driver circuit 11 and the signal line driver circuit 12 and a signal for forming an image in the pixel portion 13. Specifically, the signal generation circuit 20 is a circuit which generates and outputs an image signal (Data) input to the plurality of pixels arranged in a matrix form in the pixel portion 13, a signal for controlling operation of the scan line driver circuit 11 or the signal line driver circuit 12 (e.g., a start pulse signal (SP), a clock signal (CK), or the like), a high power supply potential ($V_{dd}$) and a low power supply potential ($V_{ss}$) which are power supply potentials, and the like. In the control circuit 10 illustrated in FIG. 2, the signal generation circuit 20 outputs the image signal (Data) to the memory circuit 21, and outputs the signal for controlling operation of the scan line driver circuit 11 or the signal line driver circuit 12 to the display control circuit 24. In the case where the image signal (Data) output from the signal generation circuit 20 to the memory circuit 21 is an analog signal, the image signal (Data) can be converted into a digital signal through an A/D converter or the like.

The memory circuit 21 includes a plurality of memories 25 which store image signals from an image signal for forming a first image to an image signal for forming an n-th image (n is a natural number greater than or equal to 2) in the pixel portion 13. Note that each memory 25 may be formed using a memory element such as a dynamic random access memory (DRAM) or a static random access memory (SRAM), for example. The number of memories 25 is not particularly limited as long as the memory 25 stores an image signal for each image formed in the pixel portion 13. Further, an image signal stored in the plurality of memories 25 are selectively read by the comparison circuit 22 and the selection circuit 23.

The comparison circuit 22 is a circuit which selectively reads an image signal for forming a k-th image (k is a natural number greater than or equal to 1 and less than n) and an image signal for forming a (k+1)-th image which are stored in the memory circuit 21, compares the image signals, and detects a difference between the image signals. Note that the k-th image and the (k+1)-th image are images which are successively displayed in the pixel portion 13. In the case where a difference is detected by the comparison of the image signals by the comparison circuit 22, two images to be formed using the image signals are assumed to be a moving image. On the other hand, in the case where a difference is not detected by the comparison of the image signals by the comparison circuit 22, two images to be formed using the image signals are assumed to be as a still image. That is, the comparison circuit 22 is a circuit which determines whether the image signals for forming successively displayed images are either image signals for displaying a moving image or image signals for displaying a still image, by the detection of a difference by the comparison circuit 22. Note that the comparison circuit 22 may be set to detect a difference when the difference exceeds a certain level.

The selection circuit 23 is a circuit which selects output of an image signal to the pixel portion based on the difference detected by the comparison circuit 22. Specifically, the selection circuit 23 is a circuit which outputs an image signal for forming an image from which a difference is detected in the comparison circuit 22 but does not output an image signal for forming an image from which a difference is not detected in the comparison circuit 22.

The display control circuit 24 is a circuit which controls supply of control signals such as a start pulse signal (SP), a clock signal (CK), a high power supply potential ($V_{dd}$), and a low power supply potential ($V_{ss}$), to the scan line driver circuit 11 and the signal line driver circuit 12. Specifically, in the case where images are assumed to be a moving image by the comparison circuit 22 (in the case where a difference between successively displayed images is detected), an image signal (Data) supplied from the selection circuit 23 is output to the signal line driver circuit 12, and control signals (a start pulse signal (SP), a clock signal (CK), a high power supply potential ($V_{dd}$), a low power supply potential ($V_{ss}$), and the like) are supplied to the scan line driver circuit 11 and the signal line driver circuit 12. On the other hand, in the case where images are assumed to be a still image by the comparison circuit 22 (in the case where a difference between successively displayed images is not detected), an image signal (Data) is not supplied from the selection circuit 23, and control signals (a start pulse signal (SP), a clock signal (CK), a high power supply potential ($V_{dd}$), a low power supply potential ($V_{ss}$), and the like) are not supplied to the scan line driver circuit 11 and the signal line driver circuit 12. That is, in the case where images are assumed to be a still image by the comparison circuit 22 (in the case where a difference between successively displayed images is not detected), the operation of the scan line driver circuit 11 and the signal line driver circuit 12 is completely stopped. Note that in the case where a period during which images are assumed to be a still image by the comparison circuit is short, supply of the high power supply potential ($V_{dd}$) and the low power supply potential ($V_{ss}$) can be continued. Note that "supply of the high power supply potential ($V_{dd}$) and the low power supply potential ($V_{ss}$)" means that a potential of a given wiring is fixed to a high power supply potential ($V_{dd}$) or a low power supply potential ($V_{ss}$). That is, a given potential of the wiring is changed to a high power supply potential ($V_{dd}$) or a low power supply potential ($V_{ss}$). Since the change in potential is accompanied by power consumption, frequent stopping and restarting of supply of a high power supply potential ($V_{dd}$) or a low power supply potential ($V_{ss}$) might result in increase of power consumption. In such a case, it is preferable that a high power supply potential ($V_{dd}$) and a low power supply potential ($V_{ss}$) be continuously supplied. Note that in the foregoing description, "a signal is not supplied" means that a potential which is different from a predetermined potential is supplied to a wiring which supplies the signal, or that the wiring is in a floating state.

In the control circuit 10, the operation of the scan line driver circuit 11 and the signal line driver circuit 12 is controlled as described above. Thus, power consumption of the liquid crystal display device can be reduced.

<Transistor 15>

The transistor 15 is a transistor whose channel formation region is formed using an oxide semiconductor layer. The oxide semiconductor layer is an oxide semiconductor layer which is highly purified and is made to be electrically i-type (intrinsic) by intentionally removing impurities such as hydrogen, moisture, hydroxyl, or hydride (also referred to as a hydrogen compound) which cause the variation from the oxide semiconductor layer in order to suppress variation in electric characteristics, and by supplying oxygen which is a major component of an oxide semiconductor and is reduced in the step of removing the impurities. Note that the band gap of the oxide semiconductor is 2 eV or more, preferably 2.5 eV or more, still preferably 3.0 eV or more.

Further, the number of carriers in the high-purity oxide semiconductor is very small (close to zero), and the carrier density is less than $1 \times 10^{14}/cm^3$, preferably less than or equal to $1 \times 10^{12}/cm^3$. That is, the carrier density of the oxide semiconductor layer is reduced as much as possible to be extremely close to zero. Since there are extremely few carriers in the oxide semiconductor layer, off-state current can be low. The smaller the amount of off-state current is, the better. Therefore, in the aforementioned transistor, off-state current per micrometer of the channel width (W) at a room temperature can be 10 aA/μm ($1 \times 10^{-17}$ A/μm) or less, and off-state current per micrometer of the channel width (W) at 85° C. can be 100 aA/μm ($1 \times 10^{-16}$ A/μm) or less. In general, in a transistor including amorphous silicon, the off-state current at a room temperature is $1 \times 10^{-13}$ A/μm or more. Further, since there is no pn junction and no hot carrier degradation, electric characteristics of the transistor is not adversely affected. Thus, an image signal holding period of each pixel 14 can be extended. That is, rewriting interval of an image signal in still image display can be increased. For example, a writing interval of an image signal can be 10 seconds or longer, preferably 30 seconds or longer, still preferably one minute or longer and shorter than 10 minutes. Increase in the writing interval makes it possible to enhance the effect of suppressing power consumption.

Note that the difficulty in flowing off-state current in the transistor can be referred as off-state resistivity. The off-state resistivity refers to resistivity of a channel formation region at the time when the transistor is off, and the off-state resistivity can be calculated from off-state current.

Specifically, the resistance when the transistor is off (off-state resistance R) can be calculated using Ohm's law from the off-state current and the drain voltage, which leads to the off-state resistivity ρ which can be calculated using Formula, ρ=RA/L (R is the off-state resistance), from the cross-sectional area A of the channel formation region and the length L of the channel formation region (which corresponds to the distance between a source electrode and a drain electrode).

Here, the cross-section area A can be obtained in accordance with the formula A=dW (d: the thickness of the channel formation region, W: the channel width). In addition, the length L of the channel formation region is a channel length L. In such a manner, off-state resistivity can be calculated from off-state current.

The off-state resistivity of the transistor including the oxide semiconductor layer in this embodiment is preferably $1 \times 10^{11} \Omega \cdot cm$ or more, far preferably $1 \times 10^{12} \Omega \cdot cm$ or more.

An oxide semiconductor layer which is highly purified by drastically removing hydrogen contained in the oxide semiconductor layer as described above is used in a channel formation region of a transistor, whereby a transistor with an extremely small amount of off-state current can be obtained. In addition, in circuit design, the oxide semiconductor layer can be regarded as an insulator when the transistor is in an off state. Further, a transistor including an oxide semiconductor layer can be expected to have a higher current supply capability in an on state than in a transistor including an amorphous silicon layer.

When design or the like is performed, it is assumed that the off-state current of a transistor including a low-temperature polysilicon layer at a room temperature is approximately 10000 times as large as the off-state current of a transistor including an oxide semiconductor layer. Therefore, in the case where the transistor including an oxide semiconductor layer is compared with the transistor including a low-temperature polysilicon layer, the voltage holding period of the transistor including an oxide semiconductor layer can be about 10000 times as long as that of the transistor including a low-temperature polysilicon layer when their storage capacitances are equal or substantially equal to each other (about 0.1 pF). As an example, when a moving image is displayed at 60 frames per second, a holding period of a transistor including an oxide semiconductor for one signal writing can be approximately 160 seconds, which is 10000 times as long as the holding period of the transistor including a low-temperature polysilicon layer. In this manner, still image display can be performed on a display portion even by less frequent writing of the image signal.

A long holding period allows frequency of supplying an image signal to a pixel to be reduced. In particular, using the aforementioned transistor is very effective for the liquid crystal display device as described above in which the image signal can be input to a pixel portion selectively. That is, although there is a possibility that an image signal is not input to the pixel in the liquid crystal display device for a long period of time, display deterioration (change) in the pixel can be suppressed by using the aforementioned transistor as a transistor for controlling input of an image signal to the pixel.

Further, when the transistor is used as a switch for controlling input of an image signal to a pixel, the size of a capacitor provided in a pixel can be reduced. Thus, the aperture ratio of the pixel can be high, and an image signal can be input to the pixel at high speed, for example.

<Liquid Crystal Element 16 and Capacitor 17>

Figure 3A:
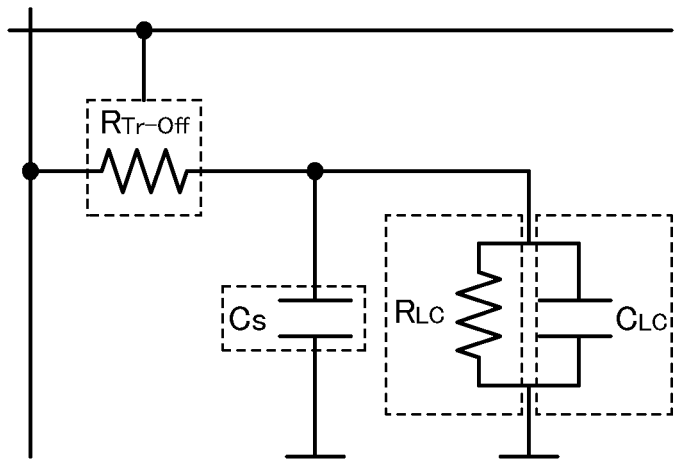
FIGS. 3A to 3C illustrate a liquid crystal display device in accordance with Embodiment 1.
Figure 3B:
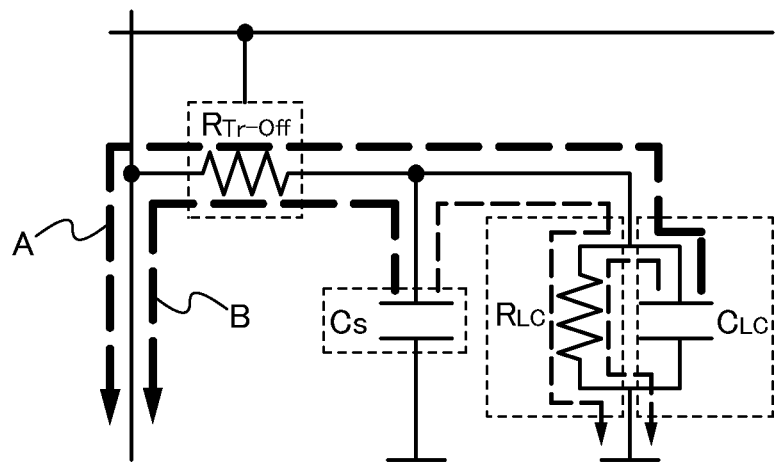
Figure 3C:
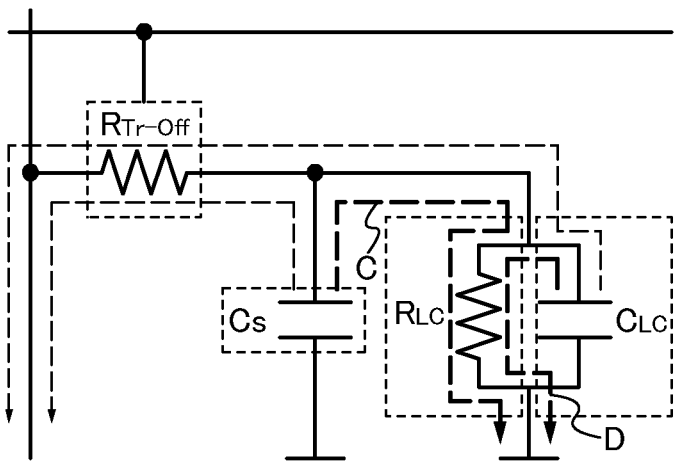

When the aforementioned transistor is used for the transistor 15 for controlling input of an image signal, it is preferable that a substance having a high specific resistivity be used as a liquid crystal material included in the liquid crystal element 16. Here, the reason for using a substance having a high specific resistivity is described with reference to FIGS. 3A to 3C. FIGS. 3A to 3C are schematic views for illustrating a path of a leaking image signal in a pixel provided with a transistor including an amorphous silicon layer and a path of a leaking image signal in a pixel provided with a transistor including the aforementioned oxide semiconductor layer.

As illustrated in FIG. 1B, the pixel includes the transistor 15, the liquid crystal element 16, and the capacitor 17. The pixel is equivalent to a circuit illustrated in FIG. 3A when the transistor 15 is in an off state. That is, the pixel is equivalent to a circuit in which the transistor 15 is assumed to be a resistor ($R_{Tr-Off}$), and the liquid crystal element 16 is assumed to include a resistor ($R_{LC}$) and a capacitor ($C_{LC}$). When an image signal is input to the pixel, the image signal is stored in the capacitor 17 ($C_S$) and the capacitor of the liquid crystal element 16 ($C_{LC}$). When the transistor 15 is brought into an off state after that, the image signal is leaked through the transistor 15 and the liquid crystal element 16 as illustrated in FIGS. 3B and 3C. FIG. 3B is a schematic view illustrating a leaking image signal in the case where the transistor 15 is a transistor including an amorphous silicon layer, and FIG. 3C is a schematic view illustrating a leaking image signal in the case where the transistor 15 is a transistor including an oxide semiconductor layer. The off-state resistance of the transistor including an amorphous silicon layer is lower than the resistance of the liquid crystal element. Therefore, the image signal is leaked mainly through the transistor including an amorphous silicon layer as illustrated in FIG. 3B (i.e., the image signal is leaked mainly through a path A and a path B in FIG. 3B). On the other hand, the off-state resistance of the transistor including a high-purity oxide semiconductor layer is higher than the resistance of the liquid crystal element. Therefore, the image signal is leaked mainly through the liquid crystal element as illustrated in FIG. 3C (i.e., the image signal is leaked mainly through a path C and a path D in FIG. 3C).

That is, though characteristics of a transistor in each pixel of a liquid crystal display device has been conventionally a rate-controlling point in image signal holding characteristics in each pixel, in the case where a transistor including a high-purity oxide semiconductor layer is used as a transistor in each pixel, a rate-controlling point therein is shifted to the resistance of a liquid crystal element. Therefore, it is preferable that a substance having a high specific resistivity be used as the liquid crystal material included in the liquid crystal element 16.

Specifically, in a liquid crystal display device whose pixel is provided with a transistor including a high-purity oxide semiconductor layer, the specific resistivity of a liquid crystal material is preferably $1 \times 10^{12} \Omega \cdot cm$ or more, still preferably over $1 \times 10^{13} \Omega \cdot cm$, still further preferably over $1 \times 10^{14} \Omega \cdot cm$. In the case where a liquid crystal element is formed using the liquid crystal material, the resistivity is preferably $1 \times 10^{11} \Omega \cdot cm$ or more, still preferably over $1 \times 10^{12} \Omega \cdot cm$, due to the possibility of enter of an impurity from an alignment film or a sealant. The value of the specific resistivity in this specification is measured at 20° C.

In the holding period in still image display, the other terminal of the liquid crystal element 16 can be in a floating state without supply of a common potential ($V_{com}$) to the terminal Specifically, a switch may be provided between the terminal and a power source for supplying a common potential ($V_{com}$). The switch may be turned on in a writing period, whereby a common potential ($V_{com}$) may be supplied from the power source. Then, the switch may be turned off in a remaining holding period, whereby the terminal may be brought into a floating state. It is preferable that the aforementioned transistor including a high-purity oxide semiconductor layer be also used for the switch. By making the other terminal of the liquid crystal element 16 into a floating state, display degradation (change) in the pixel 14 due to an irregular pulse or the like can be reduced. The reason is described as follows. When a potential of the first terminal of the transistor 15 in an off state is changed by an irregular pulse, a potential of the one terminal of the liquid crystal element 16 is also changed by capacitive coupling. At that time, in the case where a common potential ($V_{com}$) is supplied to the other terminal of the liquid crystal element 16, the change of potential is directly linked to a change of voltage applied to the liquid crystal element 16. On the other hand, in the case where the other terminal of the liquid crystal element is in a floating state, a potential of the other terminal of the liquid crystal element is also changed by capacitive coupling. Consequently, even when the potential of the first terminal of the transistor 15 is changed by an irregular pulse, the change of voltage applied to the liquid crystal element 16 can be reduced. Therefore, display degradation (change) in the pixel 14 can be reduced.

The capacitance of the capacitor 17 ($C_S$) is determined in consideration of off-state current or the like of a transistor in each pixel. However, in the case where a transistor including a high-purity oxide semiconductor layer is used for the transistor in a pixel as described above, conditions required for designing the capacitor 17 are greatly changed. The content is described below using specific numeric values.

In general, in the case where a transistor including an amorphous silicon layer is used for a transistor in a pixel, the off-state resistance is approximately $1 \times 10^{12} \Omega$, and the resistance of a liquid crystal element is approximately $1 \times 10^{15} \Omega$. Therefore, in the case where a transistor including a high-purity oxide semiconductor layer is used as a transistor in a pixel, the amount of leakage of an image signal in the pixel can be reduced to approximately $\frac{1}{1000}$. That is, the capacitance of the capacitor 17 ($C_S$) can be reduced to approximately $\frac{1}{1000}$, or a rewriting frequency of an image signal in still image display in the pixel can be reduced to approximately $\frac{1}{1000}$. For example, in the case where writing of an image signal is performed 60 times per second, the writing frequency can be reduced to approximately once every 15 seconds. Further, with the use of an element with a capacitance of about 50 fF as the capacitor 17, an image signal can be held in a pixel for about 30 seconds. As an example, in order to hold an image signal in each pixel for 5 seconds to 5 minutes inclusive, the capacitance of the capacitor 17 ($C_S$) is preferably 0.5 pF or more, still preferably 1 pF or more. Note that numeric values of various kinds in the foregoing description are estimates.

Note that the contents of Embodiment 1 or part thereof can be combined freely with the contents of Embodiments 2, 3, and 4 or part thereof or the content of Example 1 or part thereof.

(Embodiment 2)

In this embodiment, an example of the transistor in Embodiment 1 is described with reference to FIGS. 4A to 4D.

FIGS. 4A to 4D illustrate examples of a specific structure and a process for manufacturing the transistor in Embodiment 1. Note that a thin film transistor 410 illustrated in FIGS. 4A to 4D has a bottom-gate structure called a channel-etched type and is also referred to as an inverted-staggered thin film transistor. Although a single-gate thin film transistor is illustrated in FIGS. 4A to 4D, a multi-gate thin film transistor including a plurality of channel formation regions can be formed as needed.

A process for manufacturing the thin film transistor 410 over a substrate 400 is described below with reference to FIGS. 4A to 4D.

First, a conductive film is formed over the substrate 400 having an insulating surface, and then, a gate electrode layer 411 is formed through a first photolithography step. Note that a resist mask used in the step may be formed by an inkjet method. Formation of the resist mask by an inkjet method needs no photomask; thus, manufacturing cost can be reduced.

Although there is no particular limitation on a substrate which can be used as the substrate 400 having an insulating surface, it is necessary that the substrate have at least enough heat resistance to a heat treatment to be performed later. For example, a glass substrate formed using barium borosilicate glass, aluminoborosilicate glass, or the like can be used. In the case where a glass substrate is used and the temperature at which the heat treatment is to be performed later is high, a glass substrate whose strain point is greater than or equal to 730° C. is preferably used.

Further, an insulating film serving as a base film may be provided between the substrate 400 and the gate electrode layer 411. The base film has a function of preventing diffusion of an impurity element from the substrate 400, and can be formed having a single-layer structure or a layered structure using one or more of a silicon nitride film, a silicon oxide film, a silicon nitride oxide film, and a silicon oxynitride film.

The gate electrode layer 411 can be formed with a single-layer structure or a layered structure using a metal material such as molybdenum, titanium, chromium, tantalum, tungsten, aluminum, copper, neodymium, or scandium, or an alloy material which contains any of these materials as its main component.

For example, as a two-layer structure of the gate electrode layer 411, the following structure is preferable: a structure in which a molybdenum layer is stacked over an aluminum layer, a structure in which a molybdenum layer is stacked over a copper layer, a structure in which a titanium nitride layer or a tantalum nitride layer is stacked over a copper layer, or a structure in which a titanium nitride layer and a molybdenum layer are stacked. As a three-layer structure, a three-layer structure of a tungsten layer or a tungsten nitride layer, a layer of an alloy of aluminum and silicon or an alloy of aluminum and titanium, and a titanium nitride layer or a titanium layer is preferable.

Then, a gate insulating layer 402 is formed over the gate electrode layer 411.

The gate insulating layer 402 can be formed with a single-layer structure or a layered structure using one or more of a silicon oxide layer, a silicon nitride layer, a silicon oxynitride layer, a silicon nitride oxide layer, and an aluminum oxide layer by a plasma CVD method, a sputtering method, or the like. For example, a silicon oxynitride layer may be formed using a deposition gas containing silane ($SiH_4$), oxygen, and nitrogen by a plasma CVD method. Furthermore, a high-k material such as hafnium oxide ($HfO_x$) or tantalum oxide ($TaO_x$) can be used as the gate insulating layer. The gate insulating layer 402 is formed to a thickness of 100 nm to 500 nm inclusive; in the case where the gate insulating layer 402 is formed with a layered structure, for example, a first gate insulating layer with a thickness of 50 nm to 200 nm inclusive and a second gate insulating layer with a thickness of 5 nm to 300 nm inclusive are stacked.

Here, a silicon oxynitride layer is formed as the gate insulating layer 402 to a thickness of 100 nm or less by a plasma CVD method.

Moreover, as the gate insulating layer 402, a silicon oxynitride film may be formed with a high density plasma apparatus. Here, a high-density plasma apparatus refers to an apparatus which can realize a plasma density higher than or equal to $1 \times 10^{11}/cm^3$. For example, plasma is generated by applying a microwave power of 3 kW to 6 kW so that the insulating film is formed.

A silane gas ($SiH_4$), nitrous oxide ($N_2O$), and a rare gas are introduced into a chamber as a source gas to generate high-density plasma at a pressure of 10 Pa to 30 Pa, and the insulating film is formed over the substrate having an insulating surface, such as a glass substrate. After that, the supply of silane ($SiH_4$) is stopped, and a plasma treatment may be performed on a surface of the insulating film by introducing nitrous oxide ($N_2O$) and a rare gas without exposure to the air. The plasma treatment performed on the surface of the insulating film by introducing nitrous oxide ($N_2O$) and a rare gas is performed at least after the insulating film is formed. The insulating film formed through the above process procedure has small thickness and corresponds to an insulating film whose reliability can be ensured even though it has a thickness less than 100 nm, for example.

In forming the gate insulating layer 402, the flow ratio of silane ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed by using the high-density plasma apparatus can have certain thickness, the insulating film has excellent step coverage. Further, as for the insulating film formed by using the high-density plasma apparatus, the thickness of a thin film can be controlled precisely.

The insulating film formed through the above process procedure is greatly different from the insulating film formed using a conventional parallel plate plasma CVD apparatus. The etching rate of the insulating film formed through the above process procedure is lower than that of the insulating film formed using the conventional parallel plate plasma CVD apparatus by 10% or more or 20% or more in the case where the etching rates with the same etchant are compared to each other. Thus, it can be said that the insulating film formed using the high-density plasma apparatus is a dense film.

An oxide semiconductor layer which is made to be intrinsic (i-type) or substantially intrinsic in a later step (a high-purity oxide semiconductor layer) is highly sensitive to an interface state and interface charge; thus, an interface between the oxide semiconductor layer and the gate insulating layer is important. Therefore, the gate insulating layer which is in contact with the high-purity oxide semiconductor layer needs high quality. Therefore, a high-density plasma CVD apparatus with use of microwaves (2.45 GHz) is preferably employed since formation of a dense and high-quality insulating film having high withstand voltage can be formed. When the high-purity oxide semiconductor layer and the high-quality gate insulating layer are in close contact with each other, the interface state density can be reduced and favorable interface characteristics can be obtained. It is important that the gate insulating layer have lower interface state density with an oxide semiconductor layer and a favorable interface as well as having favorable film quality as a gate insulating layer.

Then, an oxide semiconductor film 430 is formed to a thickness of 2 nm to 200 nm inclusive over the gate insulating layer 402. Note that before the oxide semiconductor film 430 is formed by a sputtering method, powdery substances (also referred to as particles or dust) which are attached on a surface of the gate insulating layer 402 are preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to modify a surface. Note that instead of an argon atmosphere, a nitrogen atmosphere, a helium atmosphere, an oxygen atmosphere, or the like may be used.

Figure 4A:
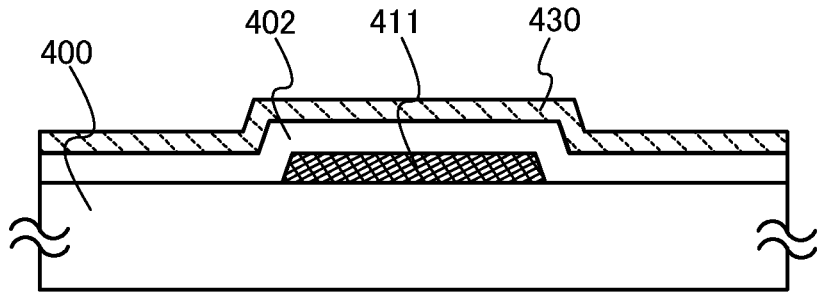
FIGS. 4A to 4D illustrate a transistor in accordance with Embodiment 2.
Figure 4B:
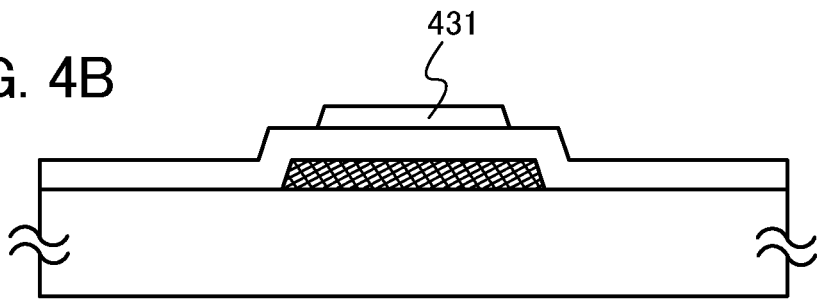
Figure 4C:
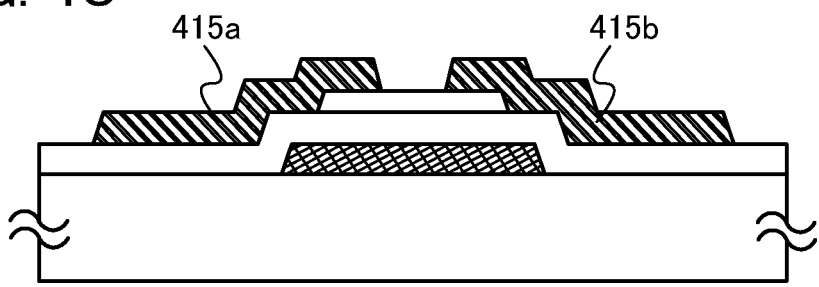
Figure 4D:
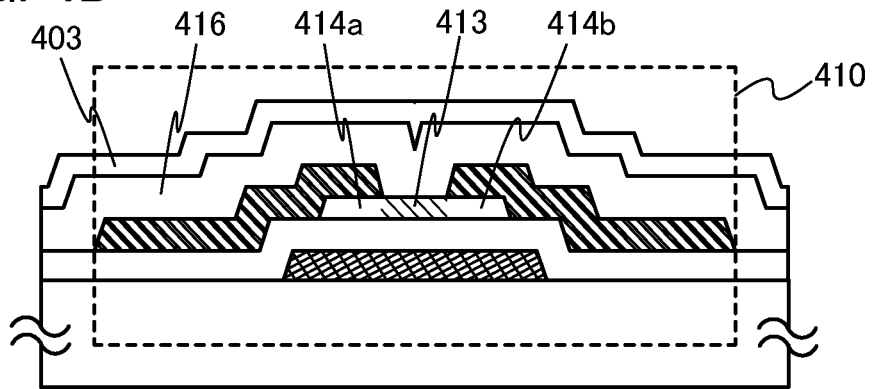

As the oxide semiconductor film 430, an In—Ga—Zn—O-based oxide semiconductor film, an In—Sn—O-based oxide semiconductor film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, an Sn—O-based oxide semiconductor film, or a Zn—O-based oxide semiconductor film is used. In this embodiment, the oxide semiconductor film 430 is formed by a sputtering method with the use of an In—Ga—Zn—O-based metal oxide target. A cross-sectional view of this stage is illustrated in FIG. 4A. Alternatively, the oxide semiconductor film 430 can be formed by a sputtering method in a rare gas (typically argon) atmosphere, an oxygen atmosphere, or a mixed atmosphere containing a rare gas (typically argon) and oxygen. Note that when a sputtering method is used, deposition is performed using a target including $SiO_2$ at 2 percent by weight or more and 10 percent by weight or less and the oxide semiconductor film 430 is made to include $SiO_x$ (X>0) which suppresses crystallization, so that crystallization can be suppressed when a heat treatment is performed for dehydration or dehydrogenation performed in a later process.

Here, film deposition is performed using a metal oxide target containing In, Ga, and Zn ($In_2O_3:Ga_2O_3:ZnO$=1:1:1 [mol], In:Ga:Zn=1:1:0.5 [atom]). The deposition condition is set as follows: the distance between the substrate and the target is 100 mm, the pressure is 0.2 Pa, the direct current (DC) power is 0.5 kW, and the atmosphere is a mixed atmosphere of argon and oxygen (argon:oxygen=30 sccm:20 sccm and the oxygen flow rate is 40%). Note that a pulse direct current (DC) power supply is preferable because powder substances generated at the time of deposition can be reduced and the film thickness can be made uniform. The In—Ga—Zn—O-based film is formed to a thickness of 5 nm to 200 nm inclusive. In this embodiment, as the oxide semiconductor film, a 20-nm-thick In—Ga—Zn—O-based film is formed by a sputtering method with the use of an In—Ga—Zn—O-based metal oxide target. As the metal oxide target containing In, Ga, and Zn, a target having a composition ratio of In:Ga:Zn=1:1:1 [atom] or a target having a composition ratio of In:Ga:Zn=1:1:2 [atom] can also be used.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by a sputtering method, there are also a reactive sputtering method in which a target substance and a sputtering gas component are chemically reacted with each other during deposition to form a thin compound film thereof, and a bias sputtering in which a voltage is also applied to a substrate during deposition.

Then, the oxide semiconductor film 430 is processed into an island-shaped oxide semiconductor layer through a second photolithography step. Note that a resist mask used in the step may be formed by an inkjet method. Formation of the resist mask by an inkjet method needs no photomask; thus, manufacturing cost can be reduced.

Next, dehydration or dehydrogenation of the oxide semiconductor layer is performed. The temperature of a first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is a kind of heat treatment apparatus, a heat treatment is performed on the oxide semiconductor layers in a nitrogen atmosphere at 450° C. for one hour, and then, the oxide semiconductor layer is not exposed to the air so that entry of water and hydrogen into the oxide semiconductor layer is prevented; thus, an oxide semiconductor layer 431 is obtained (see FIG. 4B).

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for a heat treatment using a high-temperature gas. As the gas, an inert gas which does not react with an object to be processed by a heat treatment, such as nitrogen or a rare gas such as argon is used.

For example, as the first heat treatment, GRTA by which the substrate is moved into an inert gas heated to a temperature as high as 650° C. to 700° C., heated for several minutes, and moved out of the inert gas heated to the high temperature may be performed. With GRTA, a high-temperature heat treatment for a short period of time can be achieved.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

The first heat treatment may be performed on the oxide semiconductor film 430 which has not yet been processed into the island-shaped oxide semiconductor layer. In that case, after the first heat treatment, the substrate is extracted from the heat treatment apparatus, and then the second photolithography step is performed.

The heat treatment for dehydration or dehydrogenation of the oxide semiconductor layer may be performed at any of the following timings: after the oxide semiconductor layer is formed; after a source electrode layer and a drain electrode layer are formed over the oxide semiconductor layer; and after a protective insulating film is formed over the source electrode layer and the drain electrode layer.

Further, in the case where an opening portion is formed in the gate insulating layer 402, the step of forming the opening portion may be performed either before or after the oxide semiconductor film 430 is subjected to dehydration or dehydrogenation treatment.

Note that the etching of the oxide semiconductor film 430 is not limited to wet etching, and dry etching may also be used.

As the etching gas for dry etching, a gas including chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. In addition, ITO07N (produced by KANTO CHEMICAL CO., INC.) may also be used.

The etchant after the wet etching is removed together with the etched materials by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Next, a metal conductive film is formed over the gate insulating layer 402 and the oxide semiconductor layer 431. The metal conductive film may be formed by a sputtering method or a vacuum evaporation method. As a material of the metal conductive film, an element selected from aluminum (Al), chromium (Cr), copper (Cu), tantalum (Ta), titanium (Ti), molybdenum (Mo), and tungsten (W), an alloy containing any of these elements as a component, an alloy containing any of these the elements in combination, or the like can be given. Alternatively, one or more materials selected from manganese (Mn), magnesium (Mg), zirconium (Zr), beryllium (Be), and yttrium (Y) may be used. Further, the metal conductive film may have a single-layer structure or a layered structure of two or more layers. For example, the following structures can be given: a single-layer structure of an aluminum film including silicon, a single-layer structure of a copper film, or a film including copper as a main component, a two-layer structure in which a titanium film is stacked over an aluminum film, a two-layer structure in which a copper film is formed over a tantalum nitride film or a copper nitride film, and a three-layer structure in which an aluminum film is stacked over a titanium film and another titanium film is stacked over the aluminum film. Alternatively, a film, an alloy film, or a nitride film which contains aluminum (Al) and one or more of elements selected from titanium (Ti), tantalum (Ta), tungsten (W), molybdenum (Mo), chromium (Cr), neodymium (Nd), and scandium (Sc) may be used.

If a heat treatment is performed after formation of the metal conductive film, it is preferable that the metal conductive film have heat resistance enough to withstand the heat treatment.

A third photolithography step is performed. A resist mask is formed over the metal conductive film and etching is selectively performed, so that a source electrode layer 415a and a drain electrode layer 415b are formed. Then, the resist mask is removed (see FIG. 4C).

Note that materials and etching conditions are adjusted as appropriate so that the oxide semiconductor layer 431 is not removed by etching of the metal conductive film.

Note that, in the third photolithography step, only a part of the oxide semiconductor layer 431 is etched, whereby an oxide semiconductor layer having groove (depressed portions) is formed in some cases. Alternatively, the resist mask used in the step may be formed by an inkjet method. Formation of the resist mask by an inkjet method needs no photomask; thus, manufacturing cost can be reduced.

In order to reduce the number of photomasks used in a photolithography step and reduce the number of photolithography steps, an etching step may be performed with the use of a multi-tone mask which is a light-exposure mask through which light is transmitted to have a plurality of intensities. Since a resist mask formed using a multi-tone mask has a plurality of thicknesses and can be further changed in shape by performing ashing, the resist mask can be used in a plurality of etching steps to provide different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Next, plasma treatment using a gas such as nitrous oxide ($N_2O$), nitrogen ($N_2$), or argon (Ar) is performed. By this plasma treatment, water and the like absorbed onto an exposed surface of the oxide semiconductor layer are removed. Plasma treatment may be performed using a mixture gas of oxygen and argon as well.

After the plasma treatment, an oxide insulating layer 416 which serves as a protective insulating film and is in contact with part of the oxide semiconductor layer is formed without exposure to the air.

The oxide insulating layer 416, which has a thickness of at least 1 nm or more, can be formed as appropriate by a sputtering method or the like, that is a method with which impurities such as water and hydrogen are not mixed into the oxide insulating layer 416. When hydrogen is contained in the oxide insulating layer 416, entry of the hydrogen to the oxide semiconductor layer is caused, thereby making a backchannel of the oxide semiconductor layer 431 have a lower resistance (have n-type conductivity) and forming parasitic channels. Therefore, it is important that a formation method in which hydrogen is not used is employed in order to form the oxide insulating layer 416 containing as little hydrogen as possible.

Here, a 200-nm-thick silicon oxide film is deposited as the oxide insulating layer 416 by a sputtering method. The substrate temperature in deposition may be higher than or equal to a room temperature and lower than or equal to 300° C. and in this embodiment, is 100° C. Formation of a silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target may be used. For example, the silicon oxide film can be formed using a silicon target by a sputtering method in an atmosphere including oxygen and nitrogen.

Next, a second heat treatment is performed, preferably in an inert gas atmosphere or an oxygen gas atmosphere (preferably at 200° C. to 400° C. inclusive, e.g. 250° C. to 350° C. inclusive). For example, the second heat treatment is performed in a nitrogen atmosphere at 250° C. for one hour. Through the second heat treatment, part of the oxide semiconductor layer (a channel formation region) is heated while being in contact with the oxide insulating layer 416. Thus, oxygen is supplied to part of the oxide semiconductor layer (a channel formation region).

Through the above process procedure, the oxide semiconductor layer is subjected to the heat treatment for dehydration or dehydrogenation, and then, part of the oxide semiconductor layer (a channel formation region) is selectively made to be in an oxygen excess state. As a result, a channel formation region 413 overlapping with the gate electrode layer 411 becomes i-type, and a source region 414a overlapping with the source electrode layer 415a and a drain region 414b overlapping with the drain electrode layer 415b are formed in a self-aligned manner. Accordingly, the thin film transistor 410 is formed.

In a gate bias-temperature stress test (BT test) at 85° C. with $2 \times 10^6$ V/cm for 12 hours, if an impurity is added to an oxide semiconductor, a bond between the impurity and a main component of the oxide semiconductor is broken by a high electric field (B: bias) and high temperature (T: temperature), and a generated dangling bond causes a drift of the threshold voltage ($V_{th}$). On the other hand, by removing impurities in an oxide semiconductor as much as possible, especially hydrogen or water and using the high-density plasma CVD apparatus, a dense and high-quality insulating film with high withstand voltage and good interface characteristics between the insulating film and an oxide semiconductor as described above can be obtained; thus, a transistor which is stable even in the BT test can be obtained.

Further, heat treatment may be performed at 100° C. to 200° C. inclusive for one hour to 30 hours inclusive in the air. Here, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Further, this heat treatment may be performed before formation of the oxide insulating film under a reduced pressure. Under the reduced pressure, the heat treatment time can be shortened. By the heat treatment, hydrogen is taken in the oxide insulating layer from the oxide semiconductor layer.

By the formation of the drain region 414b in part of the oxide semiconductor layer, which overlaps with the drain electrode layer 415b, reliability of the thin film transistor can be improved. Specifically, by the formation of the drain region 414b, a structure in which conductivity can be varied from the drain electrode layer 415b to the channel formation region 413 through the drain region 414b can be obtained.

Further, the source region or the drain region in the oxide semiconductor layer is formed in the entire thickness direction in the case where the thickness of the oxide semiconductor layer is 15 nm or less. In the case where the thickness of the oxide semiconductor layer is 30 nm to 50 nm inclusive, in part of the oxide semiconductor layer, that is, in a region in the oxide semiconductor layer, which is in contact with the source electrode layer or the drain electrode layer, and the vicinity thereof, resistance is reduced and the source region or the drain region is formed, while a region in the oxide semiconductor layer, which is close to the gate insulating layer, can be made to be i-type.

A protective insulating layer may be further formed over the oxide insulating layer 416. For example, a silicon nitride film is formed by an RF sputtering method. Since an RF sputtering method has high productivity, it is preferably used as a film formation method of the protective insulating layer. As the protective insulating layer, an inorganic insulating film which does not include impurities such as moisture, a hydrogen ion, and $OH^-$ and blocks entry of these from the outside is used; a silicon nitride film, an aluminum nitride film, a silicon nitride oxide film, an aluminum oxynitride film, or the like is used. In this embodiment, as the protective insulating layer, a protective insulating layer 403 is formed using a silicon nitride film (see FIG. 4D).

Note that the contents of Embodiment 2 or part thereof can be combined freely with the contents of Embodiment 1, 3, and 4 or part thereof or the content of Example 1 or part thereof.

(Embodiment 3)

In this embodiment, a structure of the liquid crystal display device described in Embodiment 1 which has a touch-panel function is described with reference to FIGS. 5A and 5B.

Figure 5A:
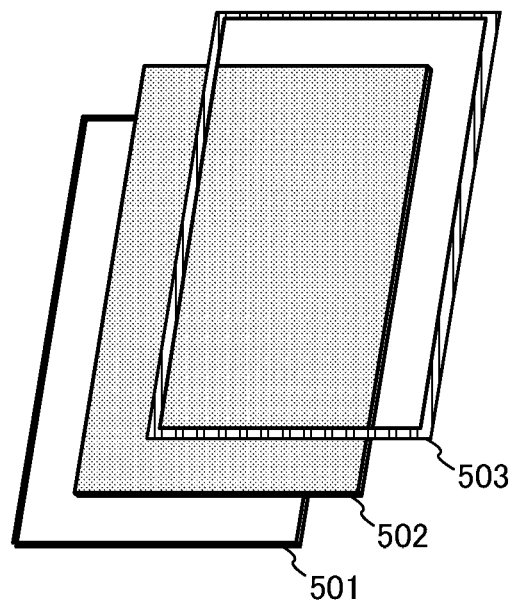
FIGS. 5A and 5B each illustrate a liquid crystal display device in accordance with Embodiment 3.

FIG. 5A is a schematic view of a liquid crystal display device of this embodiment. FIG. 5A illustrates a structure in which a touch panel unit 502 is stacked on a liquid crystal display panel 501 which is the liquid crystal display device of Embodiment 1 and they are attached with a housing 503. As the touch panel unit 502, a resistive touch sensor, a surface capacitive touch sensor, a projected capacitive touch sensor, or the like can be used as appropriate.

The liquid crystal display panel 501 and the touch panel unit 502 are manufactured separately and stacked as illustrated in FIG. 5A, whereby the cost of manufacturing a liquid crystal display device having a touch-panel function can be reduced.

Figure 5B:
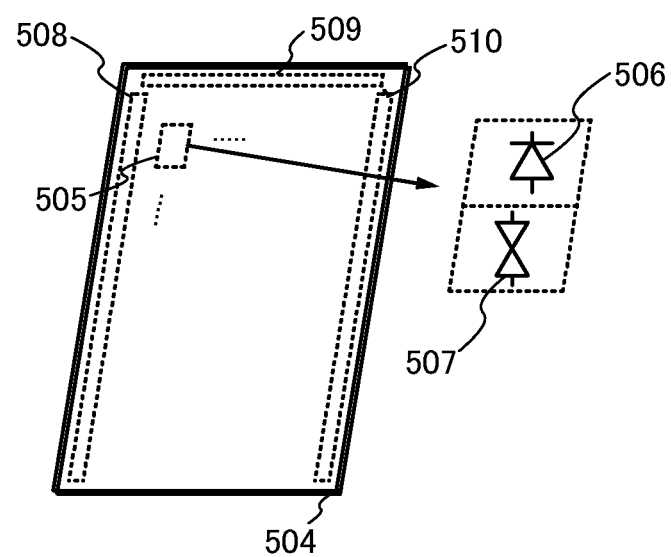

FIG. 5B illustrates a structure of a liquid crystal display device having a touch-panel function, which is different from that illustrated in FIG. 5A. A liquid crystal display device 504 illustrated in FIG. 5B includes a plurality of pixels 505 each having a light sensor 506 and a liquid crystal element 507. Therefore, the touch panel unit 502 is not necessarily stacked, which is different from that illustrated in FIG. 5A. Thus, a liquid crystal display device can be thinned. Further, a scan line driver circuit 508, a signal line driver circuit 509, and a light sensor driver circuit 510 are manufactured over the same substrate as the pixels 505. Thus, a liquid crystal display device can be reduced in size. Note that the light sensor 506 may be formed using amorphous silicon or the like and stacked on a transistor including an oxide semiconductor.

A transistor including an oxide semiconductor layer is used in a liquid crystal display device having a touch-panel function, whereby image holding characteristics in still image display can be improved. Further, power consumption can be reduced by stopping the operation of a driver circuit portion in the still image display.

Note that the contents of Embodiment 3 or part thereof can be combined freely with the contents of Embodiments 1, 2, and 4 or part thereof or the content of Example 1 or part thereof.

(Embodiment 4)

In Embodiment 4, examples of an electronic device on which the liquid crystal display device in Embodiment 1 is mounted are described with reference to FIGS. 6A to 6F. Note that the liquid crystal display device in accordance with Embodiment 1 is used for a display portion of an electronic device.

Figure 6A:
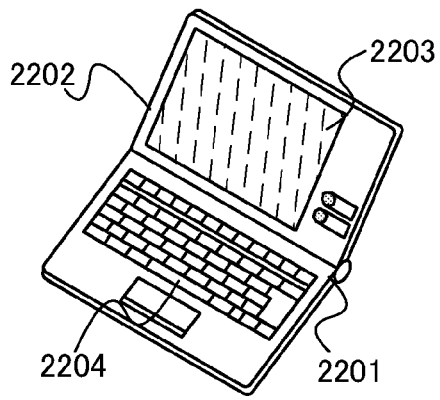
FIGS. 6A to 6F each illustrate an electronic device in accordance with Embodiment 4.

FIG. 6A illustrates a laptop computer, which includes a main body 2201, a housing 2202, a display portion 2203, a keyboard 2204, and the like. The use of the liquid crystal display device in Embodiment 1 for a display portion of the laptop computer or the like has a profound effect not only in reducing power consumption but in relieving eyestrain caused by long-term use, because of the following reasons. Display of a laptop computer or the like is changed mainly with the operation by the user. That is, the laptop computer displays a still image during intervals between the operations by a user. Further, in general, inversion drive is performed in a liquid crystal display device in order to suppress degradation of a liquid crystal material. If the inversion drive is performed in a period where a still image is displayed, flicker of an image is recognized by a user. The flicker promotes eyestrain of the user. However, with the use of the liquid crystal display device described in Embodiment 1, an image signal can be held for a long period of time in each pixel, whereby a flicker recognized by a user can be reduced in a period of still image display. Thus, it can be said that the use of the liquid crystal display device described in Embodiment 1 for a laptop computer or the like has a profound effect in relieving eyestrain of the user.

Figure 6B:
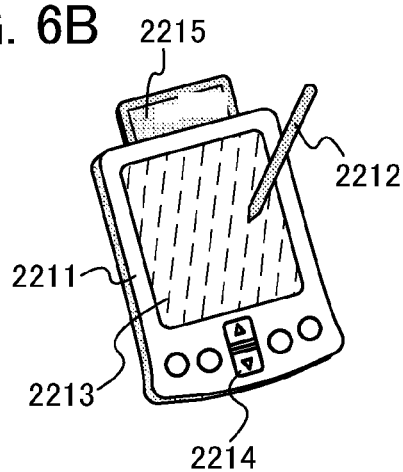

FIG. 6B illustrates a personal digital assistant (PDA), which includes a main body 2211 having a display portion 2213, an external interface 2215, an operation button 2214, and the like. A stylus 2212 for operation is included as an accessory.

Figure 6C:
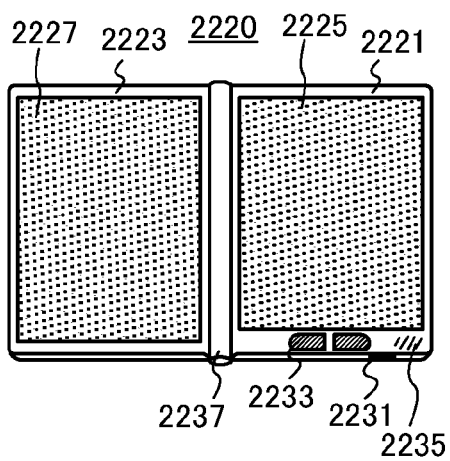

FIG. 6C illustrates an e-book reader 2220 as an example of electronic paper. The e-book reader 2220 includes two housings: housings 2221 and 2223. The housings 2221 and 2223 are bound with each other by an axis portion 2237, along which the e-book reader 2220 can be opened and closed. With such a structure, the e-book reader 2220 can be used as paper books.

A display portion 2225 is incorporated in the housing 2221, and a display portion 2227 is incorporated in the housing 2223. The display portion 2225 and the display portion 2227 may display one image or different images. In the structure where the display portions display different images from each other, for example, the right display portion (the display portion 2225 in FIG. 6C) can display text and the left display portion (the display portion 2227 in FIG. 6C) can display images.

Further, in FIG. 6C, the housing 2221 is provided with an operation portion and the like. For example, the housing 2221 is provided with a power supply 2231, an operation key 2233, a speaker 2235, and the like. With the operation key 2233, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 2220 may have a function of an electronic dictionary.

The e-book reader 2220 may be configured to transmit and receive data wirelessly. Through wireless communication, desired book data or the like can be purchased and downloaded from an electronic book server.

Note that electronic paper can be applied to devices in a variety of fields as long as they display information. For example, electronic paper can be used for posters, advertisement in vehicles such as trains, display in a variety of cards such as credit cards, and the like in addition to e-book readers.

Figure 6D:
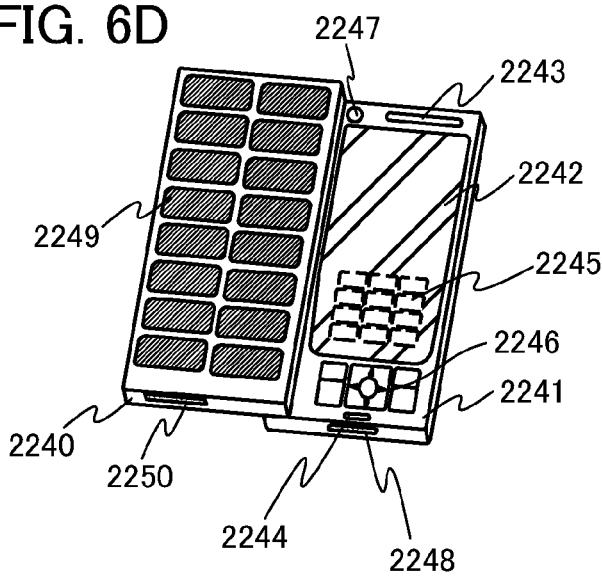

FIG. 6D illustrates a mobile phone. The mobile phone includes two housings: housings 2240 and 2241. The housing 2241 is provided with a display panel 2242, a speaker 2243, a microphone 2244, a pointing device 2246, a camera lens 2247, an external connection terminal 2248, and the like. The housing 2240 is provided with a solar cell 2249 which charges the mobile phone, an external memory slot 2250, and the like. An antenna is incorporated in the housing 2241.

The display panel 2242 has a touch panel function. A plurality of operation keys 2245 which are displayed as images is illustrated by dashed lines in FIG. 6D. Note that the mobile phone includes a booster circuit for increasing a voltage output from the solar cell 2249 to a voltage needed for each circuit. Moreover, the mobile phone can include a contactless IC chip, a small recording device, or the like in addition to the above structure.

The display orientation of the display panel 2242 is changed as appropriate in accordance with the application mode. Further, the camera lens 2247 is provided on the same surface as the display panel 2242, and thus it can be used as a video phone. The speaker 2243 and the microphone 2244 can be used for videophone calls, recording, and playing sound, etc. as well as voice calls. Moreover, the housings 2240 and 2241 in a state where they are developed as illustrated in FIG. 6D can be slid so that one is lapped over the other; therefore, the size of the portable phone can be reduced, which makes the portable phone suitable for being carried.

The external connection terminal 2248 can be connected to an AC adapter or a variety of cables such as a USB cable, which enables charging of the mobile phone and data communication. Moreover, a larger amount of data can be saved and moved by inserting a recording medium to the external memory slot 2250. Further, in addition to the above functions, an infrared communication function, a television reception function, or the like may be provided.

Figure 6E:
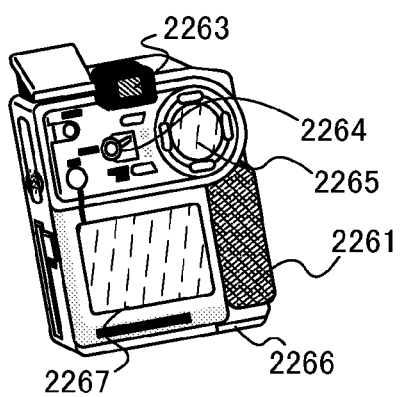

FIG. 6E illustrates a digital camera, which includes a main body 2261, a display portion (A) 2267, an eyepiece 2263, an operation switch 2264, a display portion (B) 2265, a battery 2266, and the like.

Figure 6F:
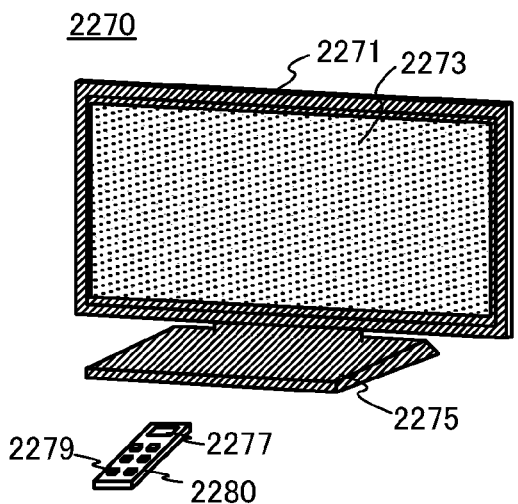

FIG. 6F illustrates a television set 2270, which includes a display portion 2273 incorporated in a housing 2271. The display portion 2273 can display images. Here, the housing 2271 is supported by a stand 2275.

The television set 2270 can be operated by an operation switch of the housing 2271 or a separate remote controller 2280. Channels and volume can be controlled with an operation key 2279 of the remote controller 2280 so that an image displayed on the display portion 2273 can be controlled. Moreover, the remote controller 2280 may have a display portion 2277 in which the information outgoing from the remote controller 2280 is displayed.

Note that the television set 2270 is preferably provided with a receiver, a modem, and the like. A general television broadcast can be received with the receiver. Moreover, when the television set is connected to a communication network with or without wires via the modem, one-way (from a sender to a receiver) or two-way (between a sender and a receiver or between receivers) data communication can be performed.

Note that the contents of Embodiment 4 or part thereof can be combined freely with the contents of Embodiments 1, 2, and 3 or part thereof or the content of Example 1 or part thereof.

EXAMPLE 1

In this example, measured values of the off-state current using a test element group (also referred to as a TEG) will be described below.

Figure 7:
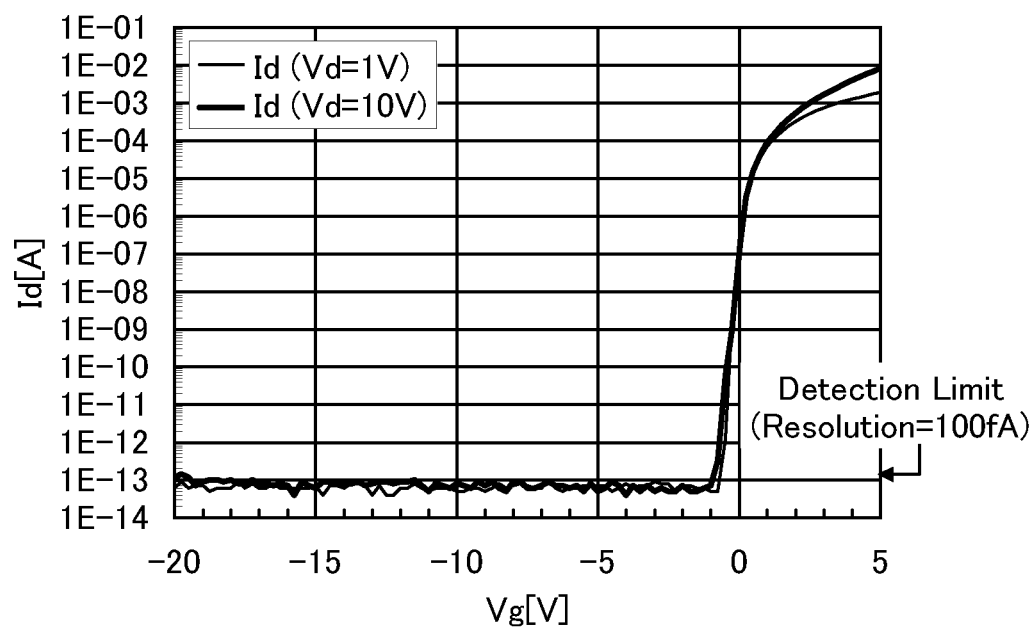
FIG. 7 is a graph showing initial characteristics of transistors in accordance with Example 1.
Figure 8A:
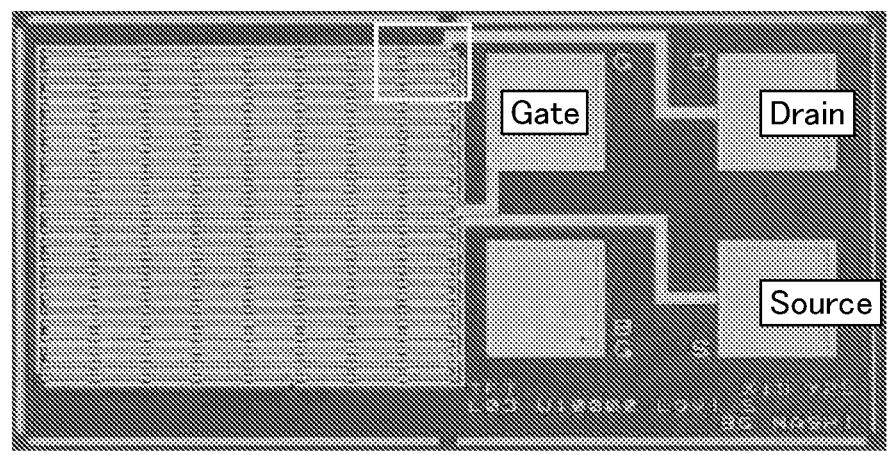
FIGS. 8A and 8B are top views of a test element for transistors in accordance with Example 1.
Figure 8B:
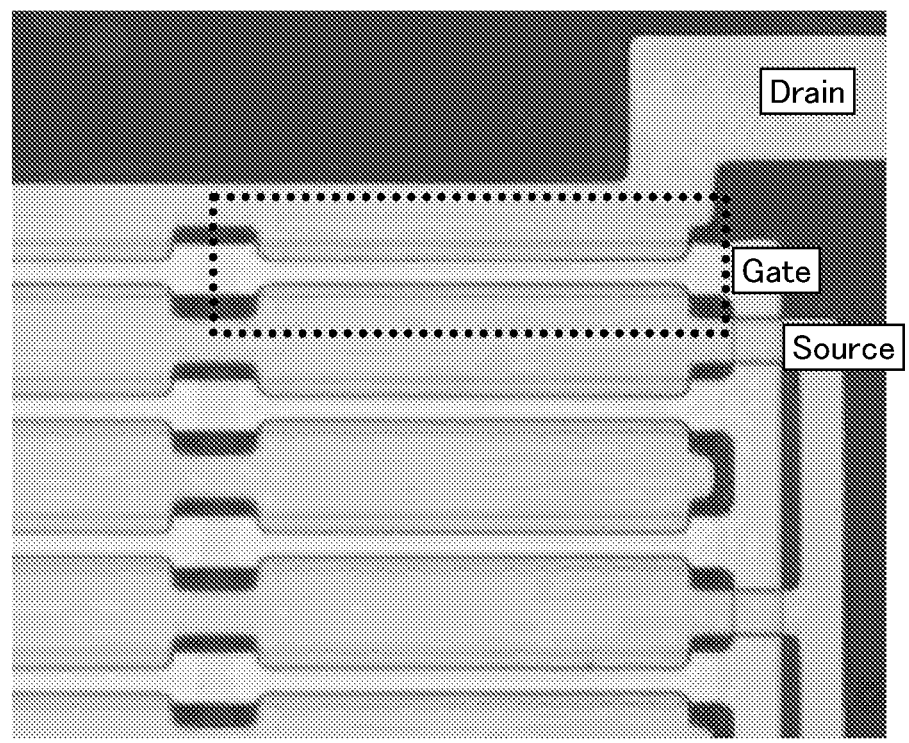

FIG. 7 shows initial characteristics of a transistor with L/W=3 μm/10000 μm in which 200 transistors each with L/W=3 μm/50 μm are connected in parallel. In addition, a top view thereof is FIG. 8A and a partially enlarged top view thereof is FIG. 8B. The region enclosed by a dotted line in FIG. 8B is a transistor of one stage with L/W=3 μm/50 μm and $L_{ov}$=1.5 μm. Here, $L_{ov}$ represents a length of a region where a source or a drain overlaps with an oxide semiconductor layer, in a channel length direction. In order to measure initial characteristics of the transistor, the changing characteristics of the source-drain current (hereinafter referred to as a drain current or Id), i.e., Vg-Id characteristics, were measured, under the conditions where the substrate temperature was set to a room temperature, the voltage between source and drain (hereinafter, a drain voltage or Vd) was set to 10 V, and the voltage between source and gate (hereinafter, a gate voltage or Vg) was changed from −20 V to +20 V. Note that FIG. 7 shows Vg in the range of from −20 V to +5 V.

As shown in FIG. 7, the transistor having a channel width W of 10000 μm has an off-state current of $1 \times 10^{-13}$ A or less at Vd of 1 V and 10 V, which is less than or equal to the resolution (100 fA) of a measurement device (a semiconductor parameter analyzer, Agilent 4156C manufactured by Agilent Technologies Inc.). That is, in the case where the channel length is 3 μm, an estimated off-state current of the transistor per micrometer in channel width is 10 aA/μm or less. In addition, in the case where the channel length is 3 μm or more, an estimated off-state current of the transistor is 10 aA/μm or less.

A method for manufacturing the transistor used for the measurement is described.

First, a silicon nitride layer was formed as a base layer over a glass substrate by a CVD method, and a silicon oxynitride layer was formed over the silicon nitride layer. A tungsten layer was formed as a gate electrode layer over the silicon oxynitride layer by a sputtering method. Here, the tungsten layer was selectively etched into the gate electrode layer.

Then, a silicon oxynitride layer having a thickness of 100 nm was formed as a gate insulating layer over the gate electrode layer by a CVD method.

Then, an oxide semiconductor layer having a thickness of 50 nm was formed over the gate insulating layer by a sputtering method using an In—Ga—Zn—O-based metal oxide target (at a molar ratio of $In_2O_3$:$Ga_2O_3$:ZnO=1:1:2). Here, the oxide semiconductor layer was selectively etched into an island-shaped oxide semiconductor layer.

Then, a first heat treatment was performed on the oxide semiconductor layer in a nitrogen atmosphere in a clean oven at 450° C. for one hour.

Then, a titanium layer (having a thickness of 150 nm) was formed as a source electrode layer and a drain electrode layer over the oxide semiconductor layer by a sputtering method. Here, the source electrode layer and the drain electrode layer were selectively etched such that 200 transistors each having a channel length L of 3 μm and a channel width W of 50 μm were connected in parallel to obtain a transistor with L/W=3 μm/10000 μm.

Next, a silicon oxide layer having a thickness of 300 nm was formed as a protective insulating layer in contact with the oxide semiconductor layer by a reactive sputtering method. Here, the silicon oxide layer which is a protective layer was selectively etched to form opening portions over the gate electrode layer, the source electrode layer, and the drain electrode layer. After that, a second heat treatment was performed in a nitrogen atmosphere at 250° C. for one hour.

Then, heat treatment was performed at 150° C. for 10 hours before the measurement of Vg-Id characteristics.

Through the above process, a bottom-gate transistor was manufactured.

The reason why the transistor has an off-state current of about $1\times10^{-13}$ A as shown in FIG. 7 is that the concentration of hydrogen in the oxide semiconductor layer could be sufficiently reduced in the above manufacturing process. The concentration of hydrogen in the oxide semiconductor layer is $1\times10^{16}/cm^3$ or less. Note that the concentration of hydrogen in the oxide semiconductor layer was measured by secondary ion mass spectrometry (SIMS).

Although the example of using an In—Ga—Zn—O-based oxide semiconductor is described, Example 1 is not particularly limited thereto. Another oxide semiconductor material, such as an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor, can also be used. As an oxide semiconductor material, an In—Al—Zn—O-based oxide semiconductor mixed with $AlO_x$ of 2.5 wt % to 10 wt % or an In—Zn—O-based oxide semiconductor mixed with $SiO_x$ of 2.5 wt % to 10 wt % can be used.

The carrier concentration of the oxide semiconductor layer which is measured by a carrier measurement device is less than $1\times10^{14}/cm^3$, preferably $1\times10^{12}/cm^3$ or less. In other words, the carrier concentration of the oxide semiconductor layer can be made as close to zero as possible.

The transistor can also have a channel length L of greater than or equal to 10 nm and less than or equal to 1000 nm, which enables an increase in circuit operation speed, and the off-state current is extremely small, which enables a further reduction in power consumption.

In addition, in circuit design, the oxide semiconductor layer can be regarded as an insulator when the transistor is in an off state.

After that, the temperature characteristics of off-state current of the transistor manufactured in this example were evaluated. Temperature characteristics are important in considering the environmental resistance, maintenance of performance, or the like of an end product in which the transistor is used. It is to be understood that a smaller amount of change is more preferable, which increases the degree of freedom for product designing.

For the temperature characteristics, the Vg-Id characteristics were obtained using a constant-temperature chamber under the conditions where substrates provided with transistors were kept at respective constant temperatures of −30° C., 0° C., 25° C., 40° C., 60° C., 80° C., 100° C., and 120° C., the drain voltage was set to 6 V, and the gate voltage was changed from −20 V to +20V.

Figure 9A:
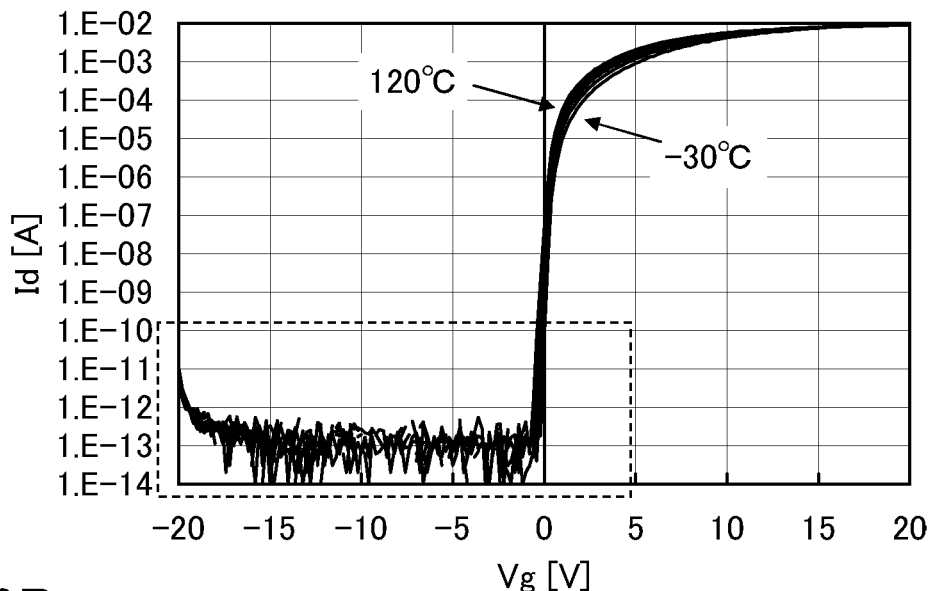
FIGS. 9A and 9B are graphs showing Vg-Id characteristics of a test element for transistors in accordance with Example 1.
Figure 9B:
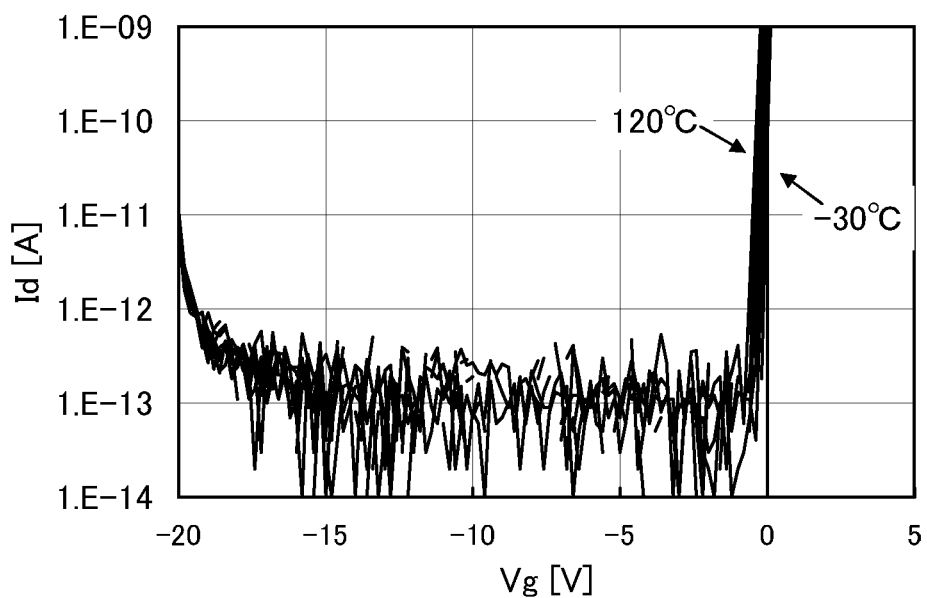

FIG. 9A shows Vg-Id characteristics measured at the above temperatures and superimposed on one another, and FIG. 9B shows an enlarged view of a range of off-state current enclosed by a dotted line in FIG. 9A. The rightmost curve indicated by an arrow in the graph is a curve obtained at −30° C.; the leftmost curve is a curve obtained at 120° C.; and curves obtained at the other temperatures are located therebetween. The temperature dependence of on-state currents can hardly be observed. On the other hand, as clearly shown also in the enlarged view of FIG. 9B, the off-state currents are less than or equal to $1\times10^{-12}$ A, which is near the resolution of the measurement device, at all temperatures except in the vicinity of a gate voltage of −20 V, and the temperature dependence thereof is not observed. In other words, even at a high temperature of 120° C., the off-state current is kept less than or equal to $1\times10^{-12}$ A, and given that the channel width W is 10000 μm, it can be seen that the off-state current is significantly small. That is, in the case where the channel length is 3 μm, an estimated off-state current of the transistor per micrometer in channel width is 100 aA/μm or less. In addition, in the case where the channel length is 3 μm or more, an estimated off-state current of the transistor is 100 aA/μm or less. Further, data in FIGS. 9A and 9B shows that off-state current of the transistor manufactured in accordance with this example is 100 aA/μm or less at −30° C. to 120° C. inclusive. In addition, off-state current of 100 aA/μm at 85° C. is naturally estimated. That is, data in FIGS. 9A and 9B shows that, in the case where constant temperature preservation test at 85° C. is performed on a liquid crystal display device in which the transistor manufactured in this example is used as a transistor in each pixel, the amount of leakage of an image signal in the pixel is reduced and display degradation (change) is suppressed.

A transistor including a purified oxide semiconductor (purified OS) as described above shows almost no dependence of off-state current on temperature. It can be said that an oxide semiconductor does not show temperature dependence when purified because the conductivity type becomes extremely close to an intrinsic type and the Fermi level is located in the middle of the forbidden band. This also results from the fact that the oxide semiconductor has a larger band gap and includes very few thermally excited carriers. In addition, the source region and the drain region are in a degenerated state, which is also a factor for showing no temperature dependence. The transistor is mainly operated with carriers which are injected from the degenerated source region to the oxide semiconductor, and the above characteristics (independence of off-state current on temperature) can be explained by independence of carrier concentration on temperature.

The results described above show that, in a transistor whose carrier density is less than $1\times10^{14}/cm^3$, preferably less than or equal to $1\times10^{12}/cm^3$, an off-state current at a room temperature is 10 aA/μm or less and an off-state current at 85° C. is 100 aA/μm or less. Further, the results show that, by using the transistor as a transistor included in each pixel of a liquid crystal display device, power consumption of the liquid crystal display device can be reduced and display degradation (reduction in display quality) of the liquid crystal display device can be suppressed. Furthermore, the results show that a liquid crystal display device in which display degradation (change) due to an external factor such as temperature is reduced can be provided.

This application is based on Japanese Patent Application serial no. 2009-288312 filed with Japan Patent Office on Dec. 18, 2009, and Japanese Patent Application serial no. 2010-

092111 filed with Japan Patent Office on Apr. 13, 2010, the entire contents of which are hereby incorporated by reference.

EXPLANATION OF REFERENCE

10: control circuit, 11: scan line driver circuit, 12: signal line driver circuit, 13: pixel portion, 14: pixel, 15: transistor, 16: liquid crystal element, 17: capacitor, 20: signal generation circuit, 21: memory circuit, 22: comparison circuit, 23: selection circuit, 24: display control circuit, 25: memory, 400: substrate, 402: gate insulating layer, 403: protective insulating layer, 410: thin film transistor, 411: gate electrode layer, 413: channel formation region, 414a: source region, 414b: drain region, 415a: source electrode layer, 415b: drain electrode layer, 416: oxide insulating layer, 430: oxide semiconductor film, 431: oxide semiconductor layer, 501: liquid crystal display panel, 502: touch panel unit, 503: housing, 504: liquid crystal display device, 505: pixel, 506: light sensor, 507: liquid crystal element, 508: scan line driver circuit, 509: signal line driver circuit, 510: light sensor driver circuit, 2201: main body, 2202: housing, 2203: display portion, 2204: keyboard, 2211: main body, 2212: stylus, 2213: display portion, 2214: operation button, 2215: external interface, 2220: e-book reader, 2221: housing, 2223: housing, 2225: display portion, 2227: display portion, 2231: power source, 2233: operation key, 2235: speaker, 2237: axis portion, 2240: housing, 2241: housing, 2242: display panel, 2243: speaker, 2244: microphone, 2245: operation key, 2246: pointing device, 2247: camera lens, 2248: external connection terminal, 2249: solar cell, 2250: external memory slot, 2261: main body, 2263: eyepiece, 2264: operation switch, 2265: display portion (B), 2266: battery, 2267: display portion (A), 2270: television set, 2271: housing, 2273: display portion, 2275: stand, 2277: display portion, 2279: operation key, 2280: remote controller

The invention claimed is:

1. A liquid crystal display device comprising:
a plurality of pixels arranged in a matrix form, each including:
a transistor, switching of which is configured to be controlled by a scan line driver circuit;
a liquid crystal element including one terminal to which an image signal is input from a signal line driver circuit through the transistor and the other terminal to which a common potential is supplied, so that voltage corresponding to the image signal is applied; and
a capacitor configured to store voltage applied to the liquid crystal element; and
a control circuit,
wherein the control circuit is configured to control operation of the scan line driver circuit and the signal line driver circuit and is configured to select input of the image signal to each pixel,
wherein the transistor includes a channel formation region comprising an oxide semiconductor layer,
wherein an amount of leakage of the image signal through the transistor in an off state is smaller than an amount of leakage of the image signal through the liquid crystal element,
wherein an off-state current of the transistor is less than or equal to 10 aA/µm at room temperature, and
wherein the off-state current of the transistor is less than or equal to 100 aA/µm at a temperature of 85° C.

2. The liquid crystal display device according to claim 1, wherein the oxide semiconductor layer is made to be substantially intrinsic.

3. The liquid crystal display device according to claim 1, wherein a specific resistivity of a liquid crystal material included in the liquid crystal element is over $1 \times 10^{14}$ Ω·cm.

4. The liquid crystal display device according to claim 1, wherein a capacitance of the capacitor is 1 pF or more.

5. An electronic device comprising the liquid crystal display device according to claim 1.

6. A liquid crystal display device comprising:
a plurality of pixels arranged in a matrix form, each including:
a transistor;
a liquid crystal element electrically connected to the transistor, the liquid crystal element including a terminal which is configured to be supplied with an image signal through the transistor; and
a capacitor configured to store a voltage applied to the liquid crystal element;
wherein the transistor includes a channel formation region comprising an oxide semiconductor layer,
wherein an amount of leakage of the image signal through the transistor in an off state of the transistor is smaller than an amount of leakage of the image signal through the liquid crystal element,
wherein an off-state current of the transistor is less than or equal to 10 aA/µm at room temperature, and
wherein the off-state current of the transistor is less than or equal to 100 aA/µm at a temperature of 85° C.

7. The liquid crystal display device according to claim 6, wherein the oxide semiconductor layer is made to be substantially intrinsic.

8. The liquid crystal display device according to claim 6, wherein a specific resistivity of a liquid crystal material included in the liquid crystal element is over $1 \times 10^{14}$ Ω·cm.

9. The liquid crystal display device according to claim 6, wherein a capacitance of the capacitor is 1 pF or more.

10. An electronic device comprising the liquid crystal display device according to claim 6.

11. A display device comprising:
a display panel comprising a pixel and a driver circuit configured to supply the pixel with an image signal; and
a touch panel adjacent to the display panel,
wherein the pixel comprises a transistor and a display element electrically connected to the transistor,
wherein the transistor comprises an oxide semiconductor layer including a channel formation region,
wherein an amount of leakage of the image signal through the transistor in an off state is smaller than an amount of leakage of the image signal through the display element,
wherein an off-state current of the transistor is less than or equal to 10 aA/µm at room temperature, and
wherein the off-state current of the transistor is less than or equal to 100 aA/µm at a temperature of 85° C.

12. The display device according to claim 11, wherein the oxide semiconductor layer is made to be substantially intrinsic.

13. The display device according to claim 11, wherein the pixel further comprises a capacitor electrically connected to the display element, and
wherein a capacitance of the capacitor is 1 pF or more.

14. The display device according to claim 11, wherein the touch panel is a surface capacitive touch sensor or a projected capacitive touch sensor.

15. The display device according to claim 11, wherein the display element is a liquid crystal element.

16. A display device comprising:
a display panel comprising a pixel and a driver circuit configured to supply the pixel with an image signal; and
a touch panel adjacent to the display panel,
wherein the pixel comprises a transistor and a display element electrically connected to the transistor,
wherein the transistor comprises an oxide semiconductor layer including a channel formation region,
wherein current flowing through the transistor in an off state is smaller than current flowing through the display element,
wherein an off-state current of the transistor is less than or equal to 10 aA/μm at room temperature, and
wherein the off-state current of the transistor is less than or equal to 100 aA/μm at a temperature of 85° C.

17. The display device according to claim 16,
wherein the oxide semiconductor layer is made to be substantially intrinsic.

18. The display device according to claim 16,
wherein the pixel further comprises a capacitor electrically connected to the display element, and
wherein a capacitance of the capacitor is 1 pF or more.

19. The display device according to claim 16, wherein the touch panel is a surface capacitive touch sensor or a projected capacitive touch sensor.

20. The display device according to claim 16, wherein the display element is a liquid crystal element.

21. A display device comprising:
a substrate;
a transistor over the substrate;
a display element over the substrate, the display element being electrically connected to the transistor;
a driver circuit configured to supply the display element with an image signal; and
a capacitive touch sensor over the substrate,
wherein the transistor comprises an oxide semiconductor layer including a channel formation region,
wherein an amount of leakage of the image signal through the transistor in an off state is smaller than an amount of leakage of the image signal through the display element,
wherein an off-state current of the transistor is less than or equal to 10 aA/μm at room temperature, and
wherein the off-state current of the transistor is less than or equal to 100 aA/μm at a temperature of 85° C.

22. The display device according to claim 21,
wherein the oxide semiconductor layer is made to be substantially intrinsic.

23. The display device according to claim 21, further comprising a capacitor electrically connected to the display element, and
wherein a capacitance of the capacitor is 1 pF or more.

24. The display device according to claim 21, wherein the capacitive touch sensor is comprised in a touch panel.

25. The display device according to claim 21, wherein the display element is a liquid crystal element.

26. A display device comprising:
a substrate;
a transistor over the substrate;
a display element over the substrate, the display element being electrically connected to the transistor;
a driver circuit configured to supply the display element with an image signal; and
a capacitive touch sensor over the substrate,
wherein the transistor comprises an oxide semiconductor layer including a channel formation region,
wherein current flowing through the transistor in an off state is smaller than current flowing through the display element,
wherein an off-state current of the transistor is less than or equal to 10 aA/μm at room temperature, and
wherein the off-state current of the transistor is less than or equal to 100 aA/μm at a temperature of 85° C.

27. The display device according to claim 26,
wherein the oxide semiconductor layer is made to be substantially intrinsic.

28. The display device according to claim 26, further comprising a capacitor electrically connected to the display element, and
wherein a capacitance of the capacitor is 1 pF or more.

29. The display device according to claim 26, wherein the capacitive touch sensor is comprised in a touch panel.

30. The display device according to claim 26, wherein the display element is a liquid crystal element.

* * * * *